(12) United States Patent
Lien et al.

(10) Patent No.: US 11,456,333 B2
(45) Date of Patent: *Sep. 27, 2022

(54) THREE-DIMENSIONAL NAND MEMORY DEVICE CONTAINING TWO TERMINAL SELECTOR AND METHODS OF USING AND MAKING THEREOF

(71) Applicant: SANDISK TECHNOLOGIES LLC, Addison, TX (US)

(72) Inventors: Yu-Chung Lien, San Jose, CA (US); Jiahui Yuan, Fremont, CA (US); Deepanshu Dutta, Fremont, CA (US); Christopher Petti, Mountain View, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,654

(22) Filed: Jun. 17, 2020

(65) Prior Publication Data
US 2020/0373355 A1 Nov. 26, 2020

Related U.S. Application Data

(63) Continuation of application No. 16/422,187, filed on May 24, 2019, now Pat. No. 10,727,276.

(51) Int. Cl.
*G11C 11/16* (2006.01)
*H01L 27/24* (2006.01)
*H01L 43/12* (2006.01)
*H01L 45/00* (2006.01)
*G11C 13/00* (2006.01)
(Continued)

(52) U.S. Cl.
CPC ...... *H01L 27/2463* (2013.01); *G11C 11/1659* (2013.01); *G11C 11/1673* (2013.01);
(Continued)

(58) Field of Classification Search
CPC ............ G11C 11/1659; G11C 11/1673; G11C 11/1675; G11C 13/0004; G11C 13/003;
(Continued)

(56) References Cited

U.S. PATENT DOCUMENTS 5,915,167 A 6/1999 Leedy
9,502,471 B1 11/2016 Lu et al.
(Continued)

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
(Continued)

*Primary Examiner* — Sung Il Cho
(74) *Attorney, Agent, or Firm* — The Marbury Law Group PLLC

(57) ABSTRACT

A three-dimensional memory device includes an alternating stack of insulating layers and electrically conductive word line layers located over a substrate, and a plurality of vertical memory strings. Each vertical memory string includes a series connection of a memory stack structure and a selector element. Each of the memory stack structures extends through the alternating stack and includes a respective memory film and a respective vertical semiconductor channel. Each of the selector elements includes a two terminal device that is configured to provide at least two different resistivity states.

20 Claims, 40 Drawing Sheets

(51) Int. Cl.
*H01L 43/02* (2006.01)
*H01L 27/22* (2006.01)
*G11C 16/04* (2006.01)

(52) U.S. Cl.
CPC ........ *G11C 11/1675* (2013.01); *G11C 13/003* (2013.01); *G11C 13/0004* (2013.01); *G11C 13/004* (2013.01); *G11C 13/0011* (2013.01); *G11C 13/0069* (2013.01); *G11C 13/0097* (2013.01); *G11C 16/0483* (2013.01); *H01L 27/222* (2013.01); *H01L 43/02* (2013.01); *H01L 43/12* (2013.01); *H01L 45/06* (2013.01); *H01L 45/08* (2013.01); *H01L 45/1675* (2013.01); *H01L 45/1233* (2013.01)

(58) Field of Classification Search
CPC ............ G11C 13/0069; G11C 13/0097; H01L 27/2463; H01L 27/222
USPC ........................................................ 365/148
See application file for complete search history.

(56) References Cited

U.S. PATENT DOCUMENTS

| | | | |
|---|---|---|---|
| 10,224,104 | B2 | 3/2019 | Chowdhury et al. |
| 10,347,647 | B1 | 6/2019 | Hosoda et al. |
| 10,388,646 | B1 | 8/2019 | Stewart et al. |
| 2012/0305881 | A1 | 12/2012 | Wong et al. |
| 2013/0258752 | A1* | 10/2013 | Park .................. H01L 27/2481 257/5 |
| 2015/0340406 | A1 | 11/2015 | Jo |
| 2017/0236896 | A1* | 8/2017 | Lu .................... H01L 27/11575 257/314 |
| 2017/0278571 | A1* | 9/2017 | Chowdhury ...... H01L 27/11582 |
| 2018/0138189 | A1 | 5/2018 | Kai et al. |
| 2018/0233513 | A1 | 8/2018 | Zhang et al. |
| 2019/0027201 | A1 | 1/2019 | Petti et al. |
| 2019/0287979 | A1 | 9/2019 | Hirayama et al. |
| 2019/0363132 | A1 | 11/2019 | Zhang |
| 2019/0393266 | A1 | 12/2019 | Ando et al. |
| 2020/0020396 | A1* | 1/2020 | Kanamori .......... G11C 13/0069 |
| 2020/0168623 | A1 | 5/2020 | Nishikawa et al. |
| 2021/0318395 | A1* | 10/2021 | Ueki ...................... H01L 43/08 |

OTHER PUBLICATIONS

Cimalla et al., "Densification of Thin Aluminum Oxide Films by Thermal Treatments," Materials Sciences and Applications, 2014, 5, pp. 628-638.

Nowicki, J.S., "Properties of rf-sputtered Al2O3 Films Deposited by Planar Magnetron," J. of Vacuum Sci. and Tech, 14, 127 (1977), 8pgs.

Potts et al., "Plasma-enhanced and Thermal Atomic Layer Deposition of Al2O3 using Dimethylaluminum Isopropoxide as an Alternative Aluminum Precursor," J. of Vacuum Sci. and Tech, A 30, 021505 (2012), 13pgs.

Wong et al., "Metal-Oxide RRAM," Proceedings of the IEEE, vol. 100, No. 6, Jun. 2012.

Robayo et al., "Statistical Analysis of CBRAM Endurance," 2018 International Symposium on VLSI Technology on VLSI Technology, Systems and Application (VLSI-TSA), 978-1-5386-4825-4, 2018 IEEE.

Kim et al., "Resistive Switching of Aluminum Oxide for Flexible Memory," Applied Physics Letters 92, 223508 (2008).

Ielmini, Daniele, "Modeling the Universal Set/Reset Characteristics of Bipolar RRAM by Field-and Temperature-Drive Filament Growth," IEEE Transactions on Electron Devices, vol. 58, No. 12, Dec. 2011.

Park et al., "Reliable Resistive Switching Memory based on Oxygen-Vacancy-Controlled Bilayer Structures," RSC Adv., 2016, 6, 21736-21741.

Wang et al., "Functionally Complete Boolean Logic in 1T1R Resistive Random Access Memory," IEEE Electron Device Letters, vol. 38, No. 2, Feb. 2017.

Jurczak, G. "Advances and Trends of RRAM Technology," IMEC, Presentation Taipei, Taiwan, Sep. 2-4, 2015.

"High-Reliability Read-Method for Spin-Torque-Transfer MRAM, Next-Generation Non-Volatile Memory," Fujitsu Laboratories and University of Toronto, IEEE International Solid State Circuits Conference 2010 (ISSCC 2010), San Francisco, CA, Feb. 7-11, 2010.

Lim et al., "Excellent Threshold Switching Device with Atom-Scale Metal Filament for Steep Slope, Ultra Low Voltage FET Applications," IEDM Proceedings 16-870, p. 34.7.1, 2016.

International Search Report and Written Opinion, International Patent Application No. PCT/US2019/068679, dated Apr. 5, 2020, 12 pgs.

Micheloni, R. et al., "3—Multi-bit NAND Flash memories for ultra-high density storage devices," Editor(s): Yoshio Nishi, Advances in Non-Volatile Memory and Storage Technology, Woodhead Publishing, (2014), pp. 75-119, ISBN9780857098030, https://doi.org/10.1533/9780857098092.1.75.

Linn, E. et al., "Complementary resistive switches for passive nanocrossbar memories," Nature Mater, vol. 9, pp. 403-406 (2010). https://doi.org/10.1038/nmat2748.

U.S. Appl. No. 16/422,187, filed May 24, 2019, Sandisk Technologies LLC.

* cited by examiner

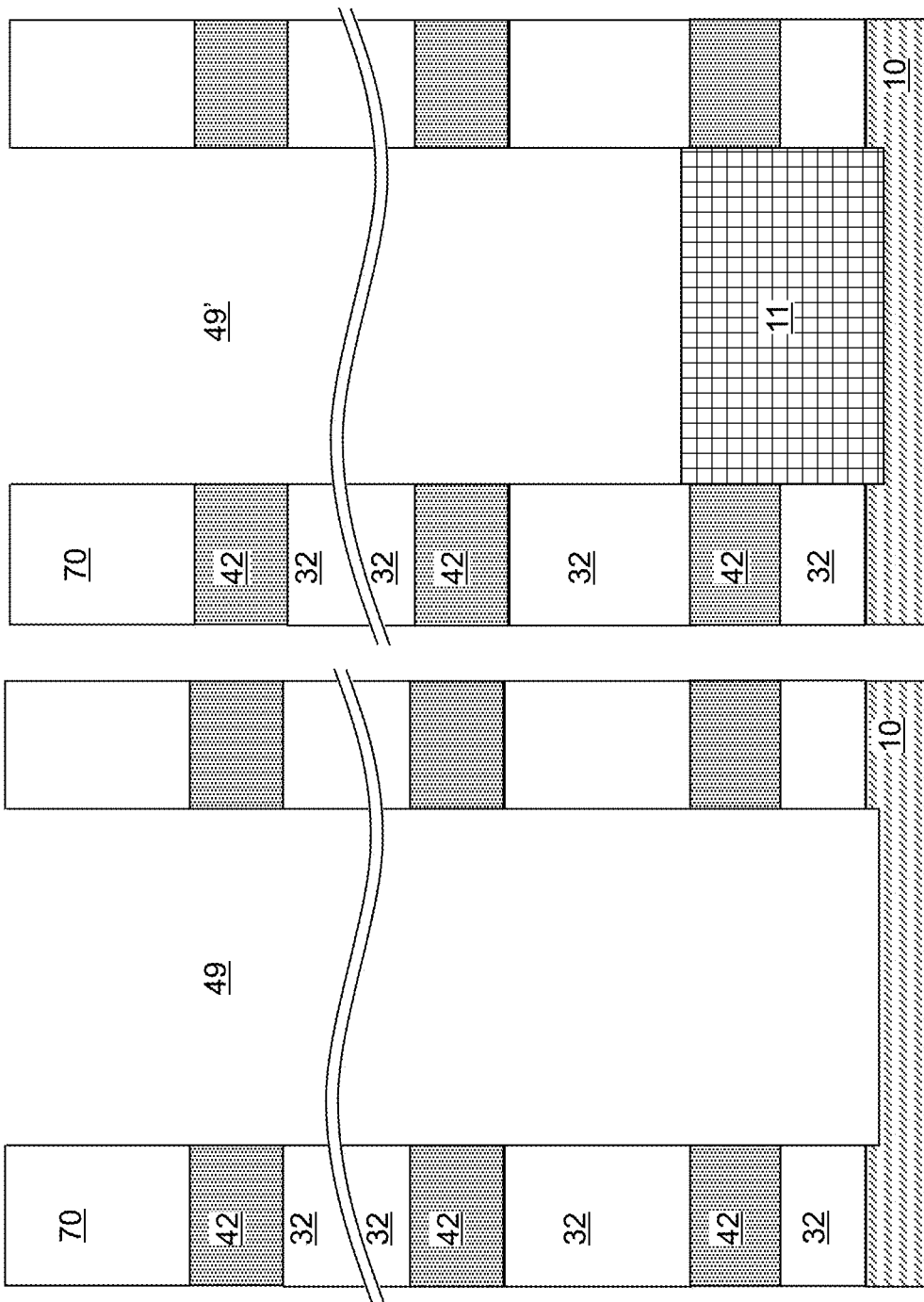

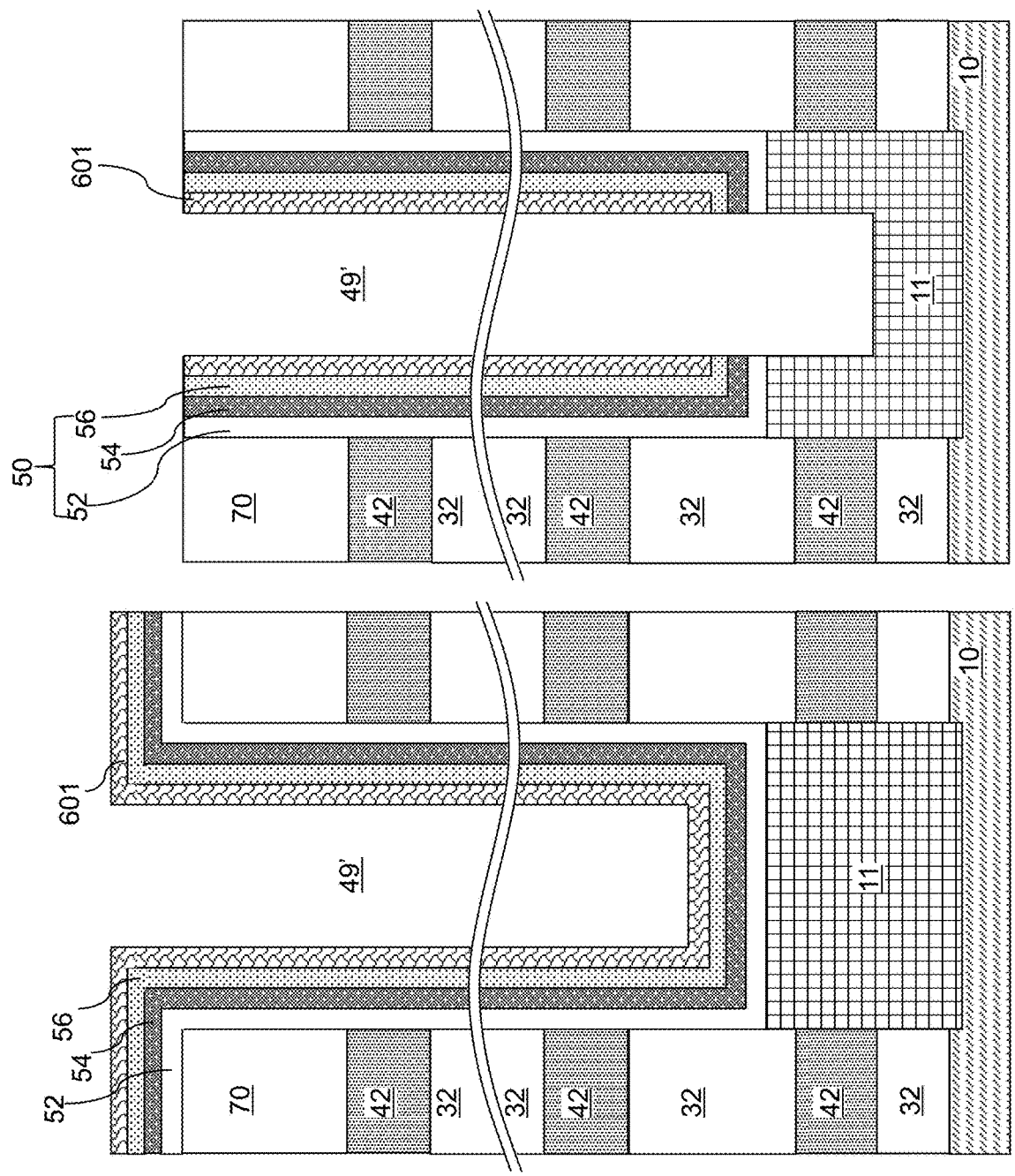

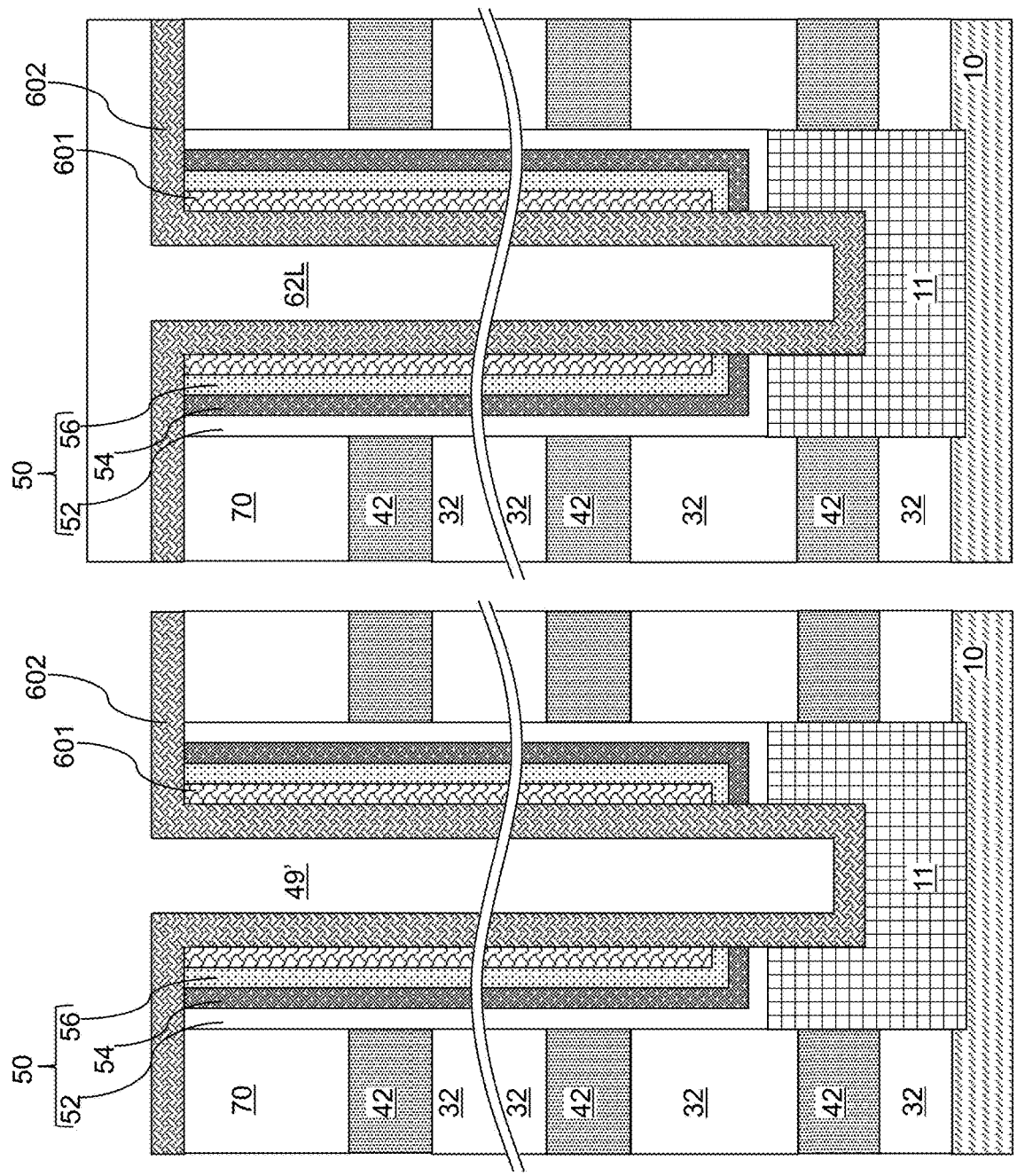

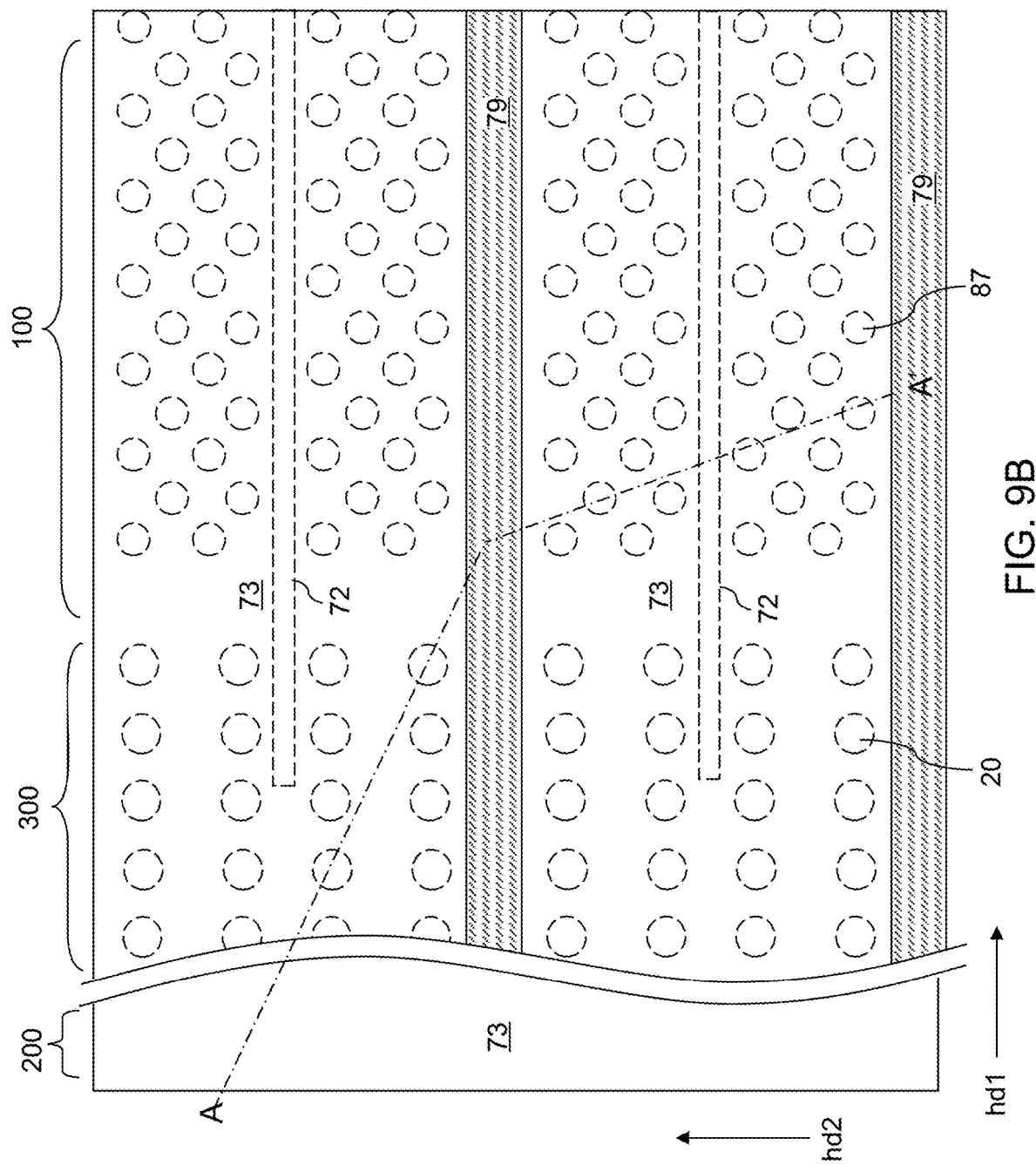

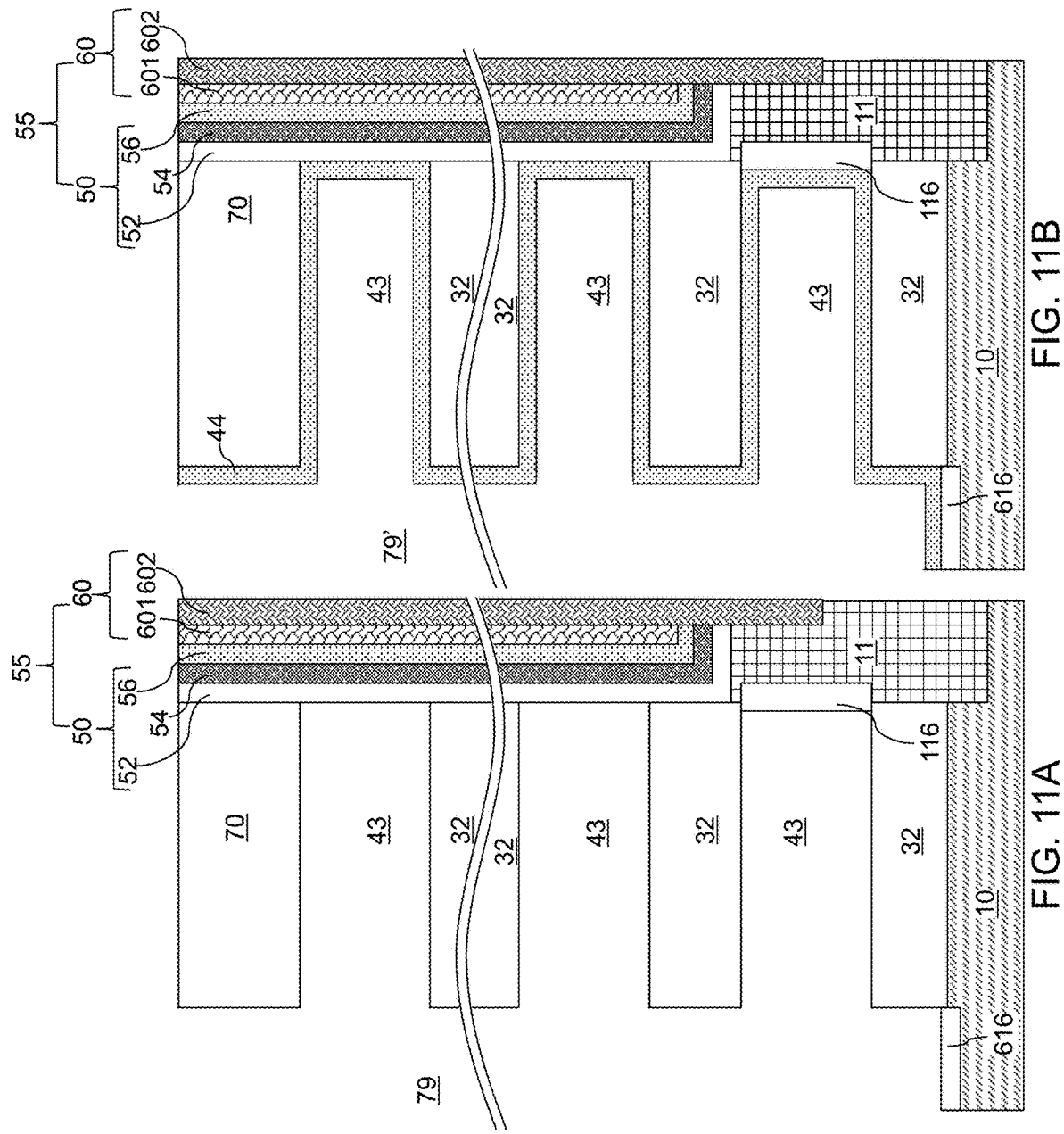

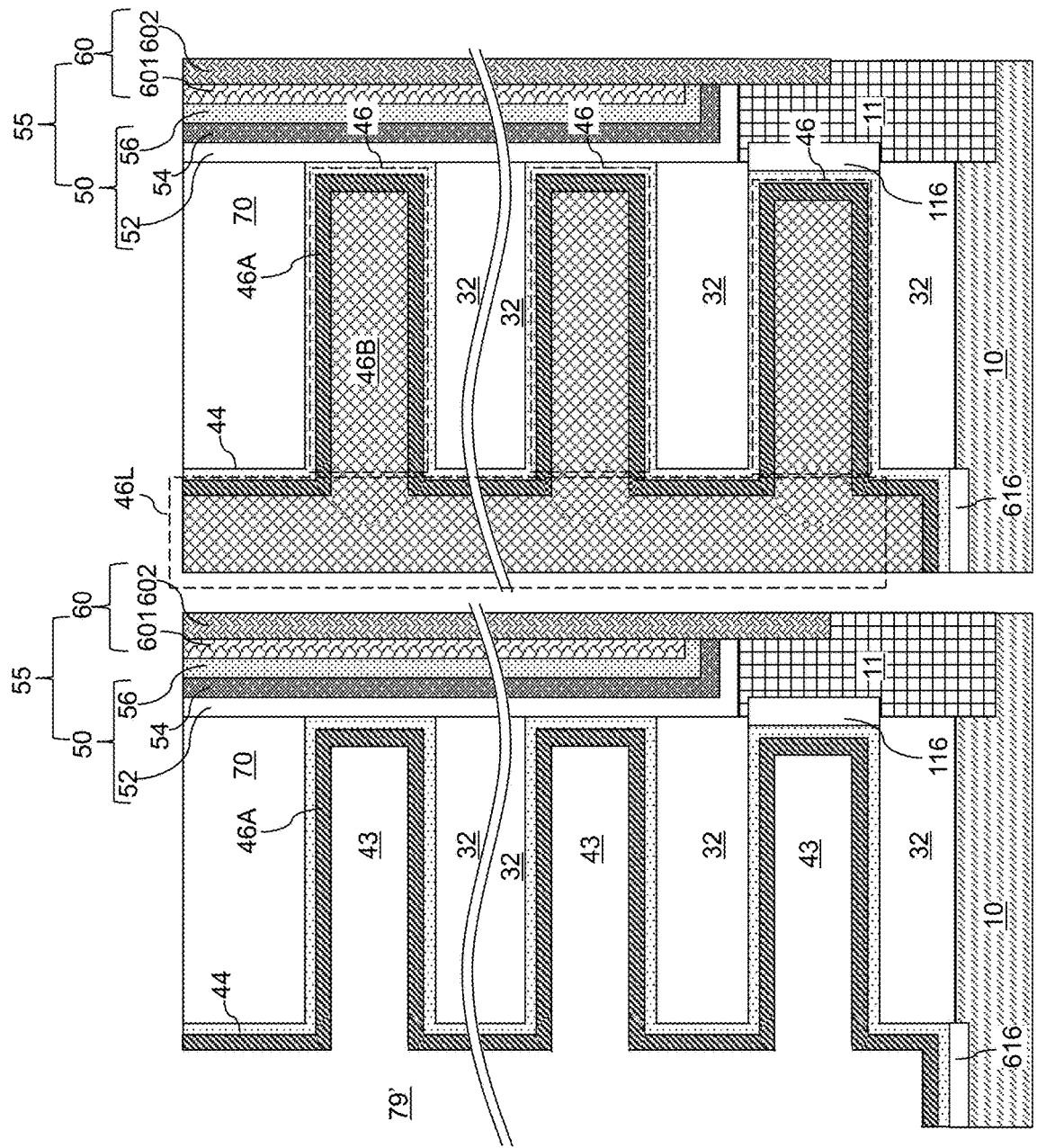

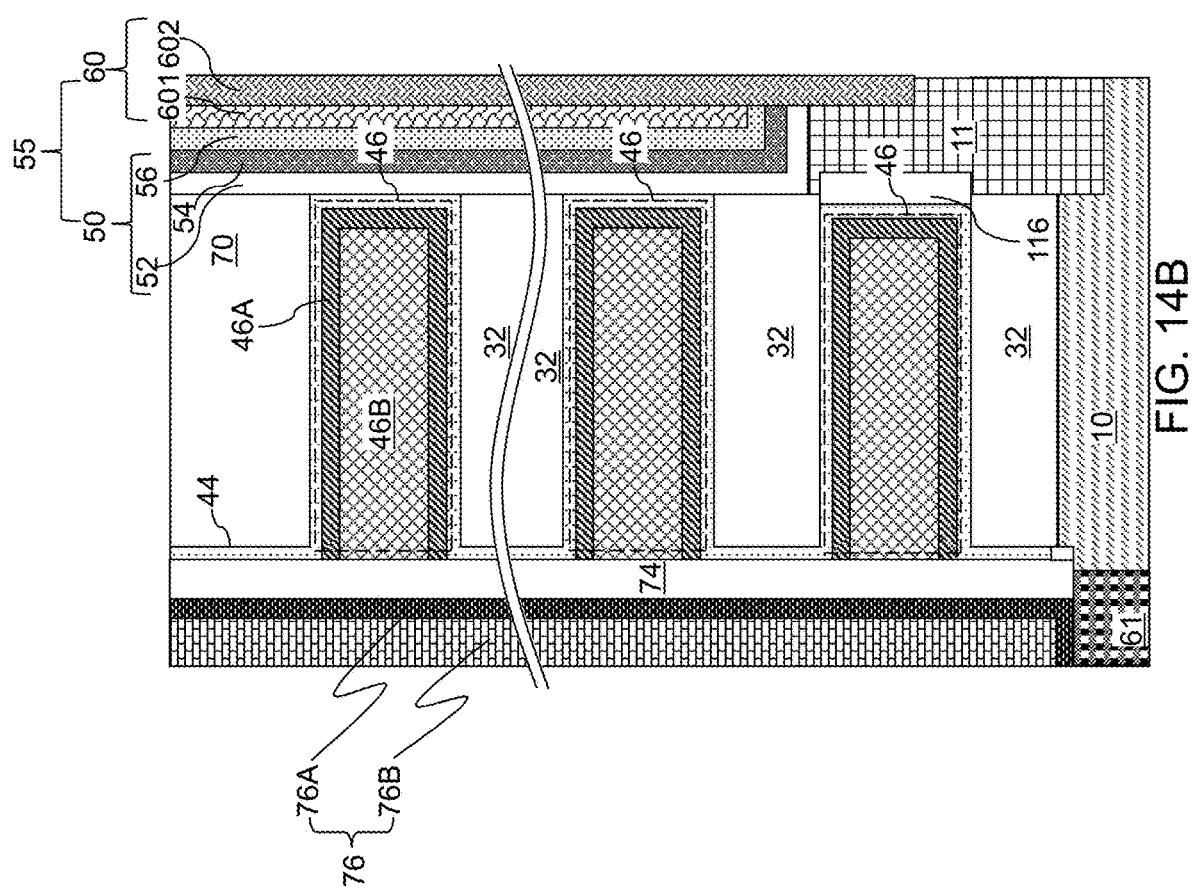

THREE-DIMENSIONAL NAND MEMORY DEVICE CONTAINING TWO TERMINAL SELECTOR AND METHODS OF USING AND MAKING THEREOF

FIELD

The present disclosure relates generally to the field of semiconductor devices, and particular to a three-dimensional NAND memory device containing a two terminal selector and methods of using and manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive word line layers located over a substrate, and a plurality of vertical memory strings. Each vertical memory string includes a series connection of a memory stack structure and a selector element. Each of the memory stack structures extends through the alternating stack and includes a respective memory film and a respective vertical semiconductor channel. Each of the selector elements includes a two terminal device that is configured to provide at least two different resistivity states.

According to another aspect of the present disclosure, a method of operating the above three-dimensional memory device includes activating a first group of vertical memory strings by setting each selector element within the first group to a low resistivity state and deactivating a second group of vertical memory strings by setting each selector element within the second group to a high resistivity state, and performing an operation selected from programming or reading at least one memory element within the first group of vertical memory strings while the second group of vertical memory strings remains deactivated.

According to yet another aspect of the present disclosure, a method of forming a three-dimensional memory device is provided, which comprises: forming an alternating stack of insulating layers and electrically conductive layers and a two-dimensional array of memory stack structures vertically extending therethrough over a substrate, wherein each of the memory stack structures includes a respective memory film and a respective vertical semiconductor channel; and forming a two-dimensional array of selector elements over the two-dimensional array of memory stack structures, wherein a two-dimensional array of series connections of a memory stack structure and a selector element is formed. Each of the selector elements includes a two terminal device that is configured to provide at least two different resistivity states.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIG. 9B is a partial see-through top-down view of the exemplary structure of FIG. 9A. The vertical plane A-A' is the plane of the schematic vertical cross-sectional view of FIG. 9A.

FIGS. 11A-11D are sequential vertical cross-sectional views of a region of the exemplary structure during formation of electrically conductive layers according to an embodiment of the present disclosure.

FIG. 14B is a magnified view of a region of the exemplary structure of FIG. 14A.

DETAILED DESCRIPTION

Figure 1:
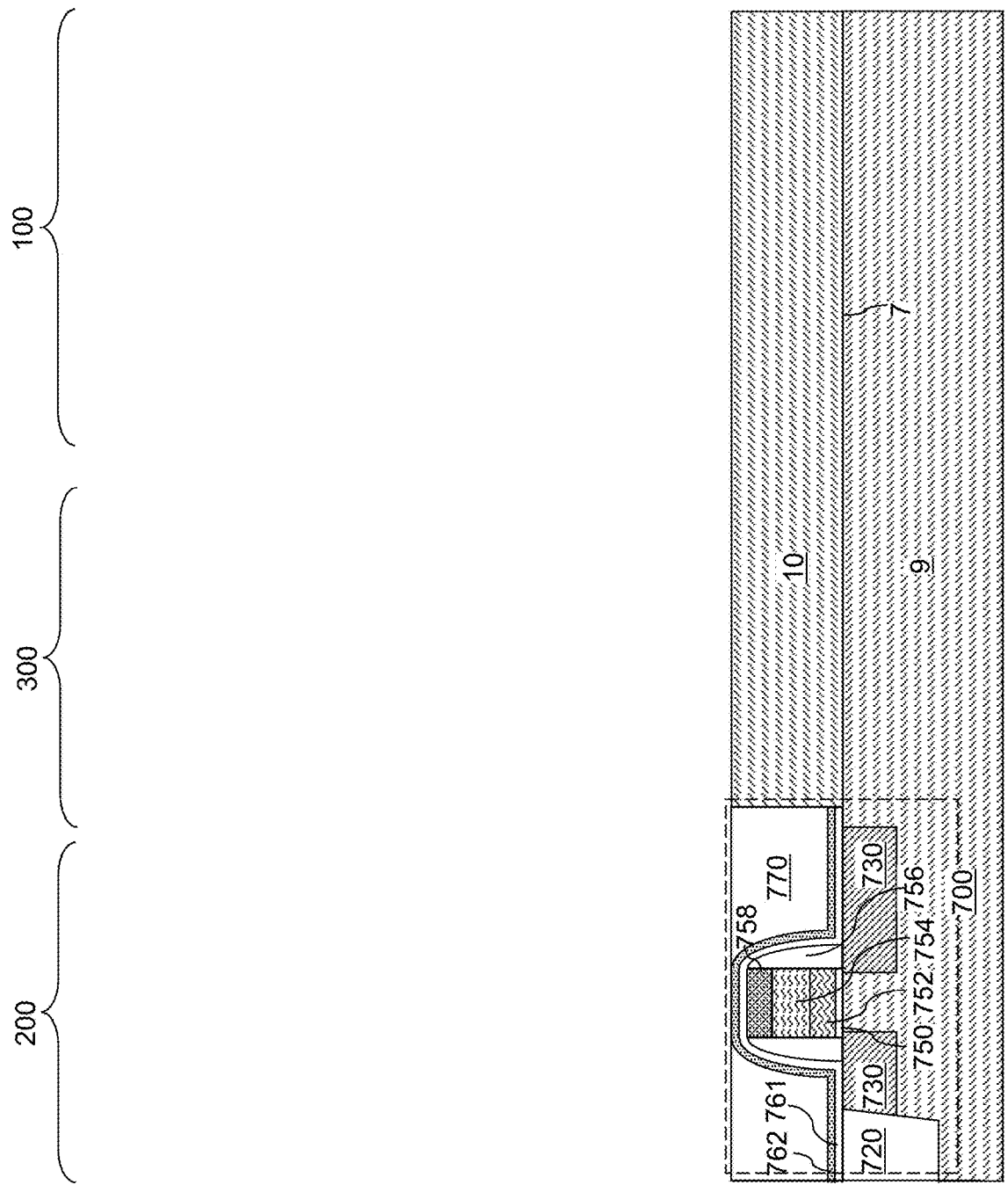
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device containing a two terminal selector and methods of using and manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded to each other, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected for a read operation.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulating material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Optionally, at least one semiconductor device 700 for a peripheral (e.g., driver) circuitry, such as sense amplifiers, etc., can be formed on a portion of the substrate semiconductor layer 9. Alternatively, the semiconductor devices 700 of the peripheral circuitry may be formed on a separate substrate and then bonded to the memory device formed on the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
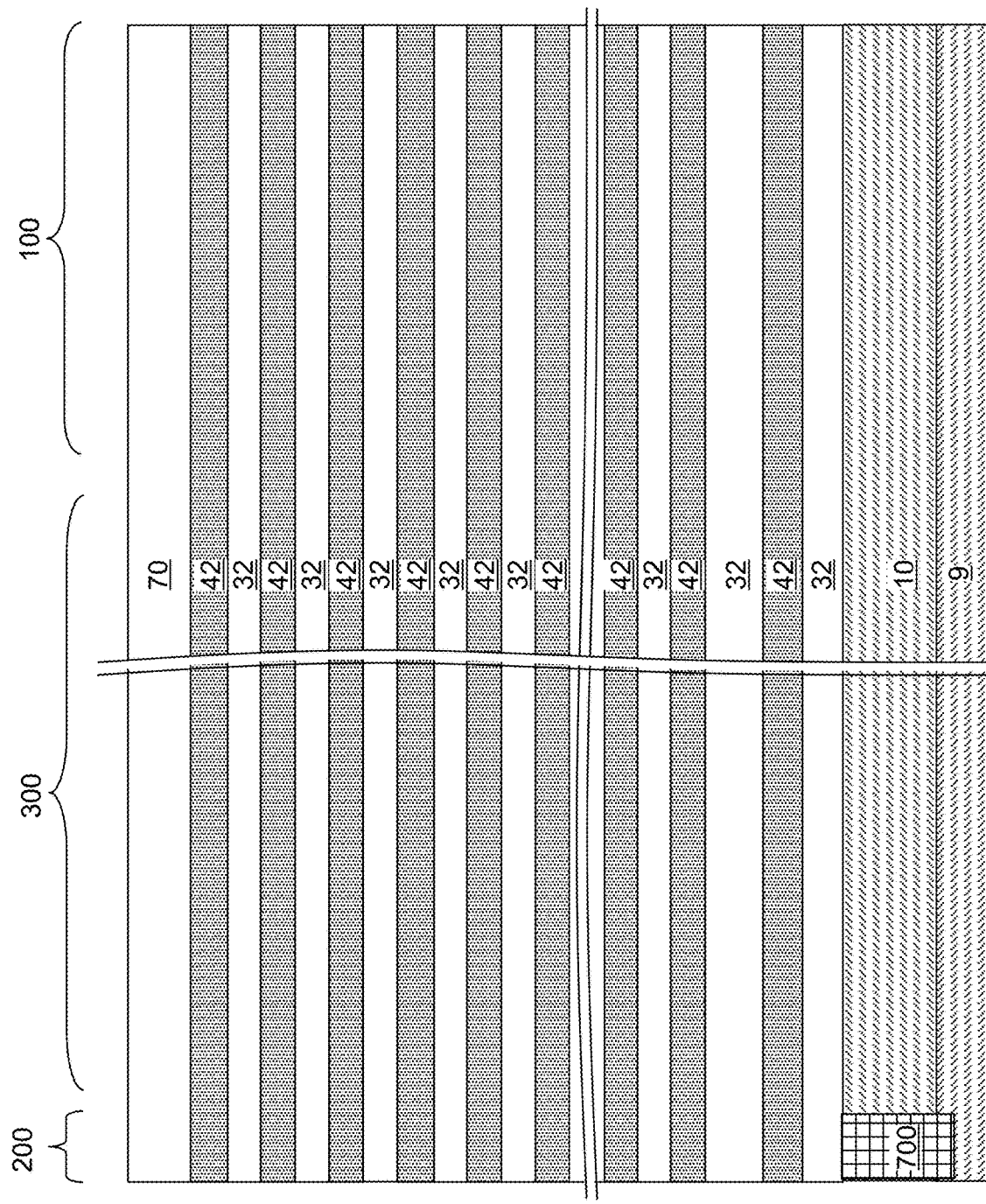
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
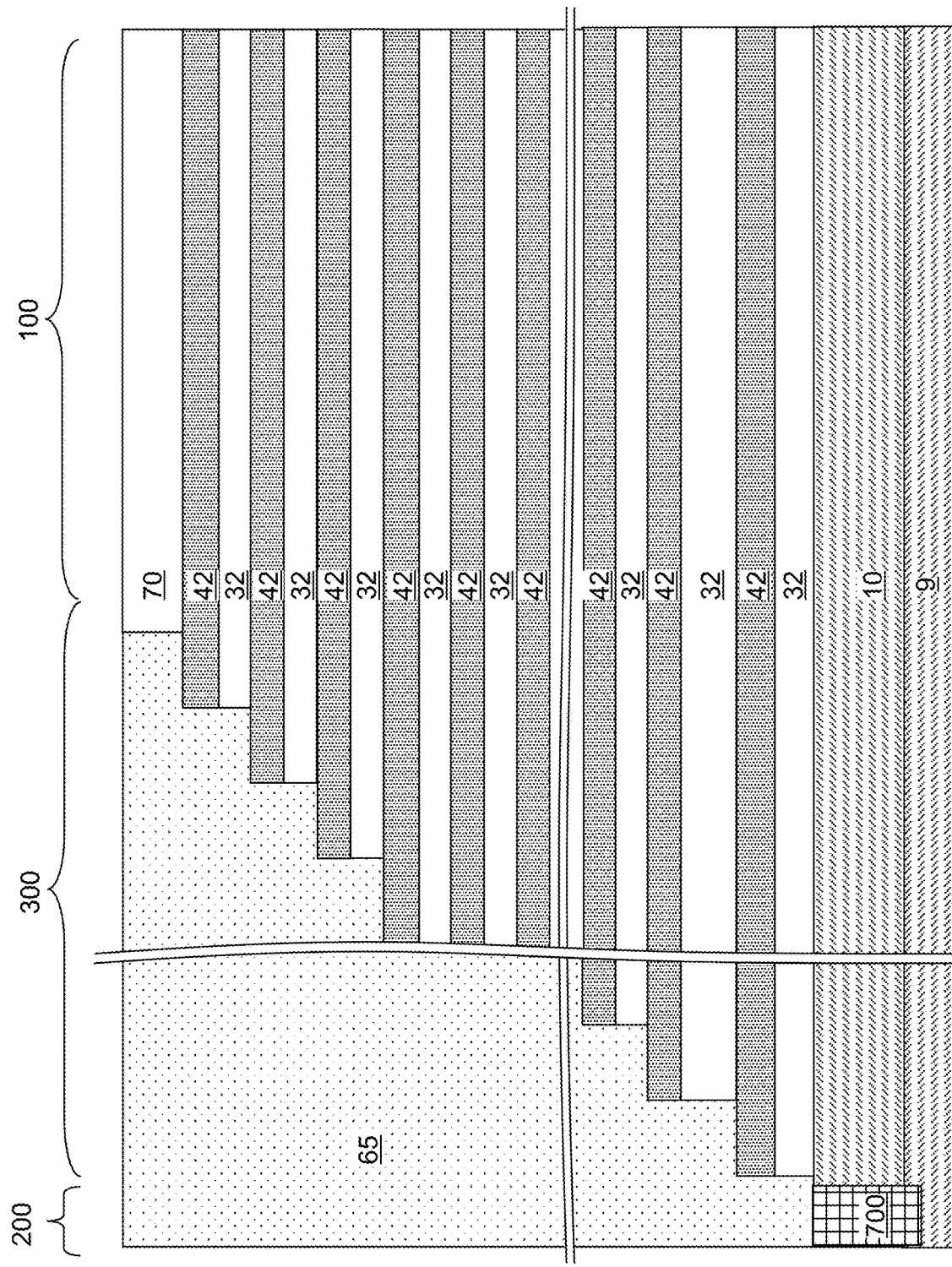
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located adjacent to the memory array region 100, and which may be located between the memory array region 100 and the optional peripheral device region 200 containing the at least one semiconductor device 700 for the peripheral circuitry, if the peripheral device region 200 is present on the same substrate (9, 10) as the memory array region 100. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
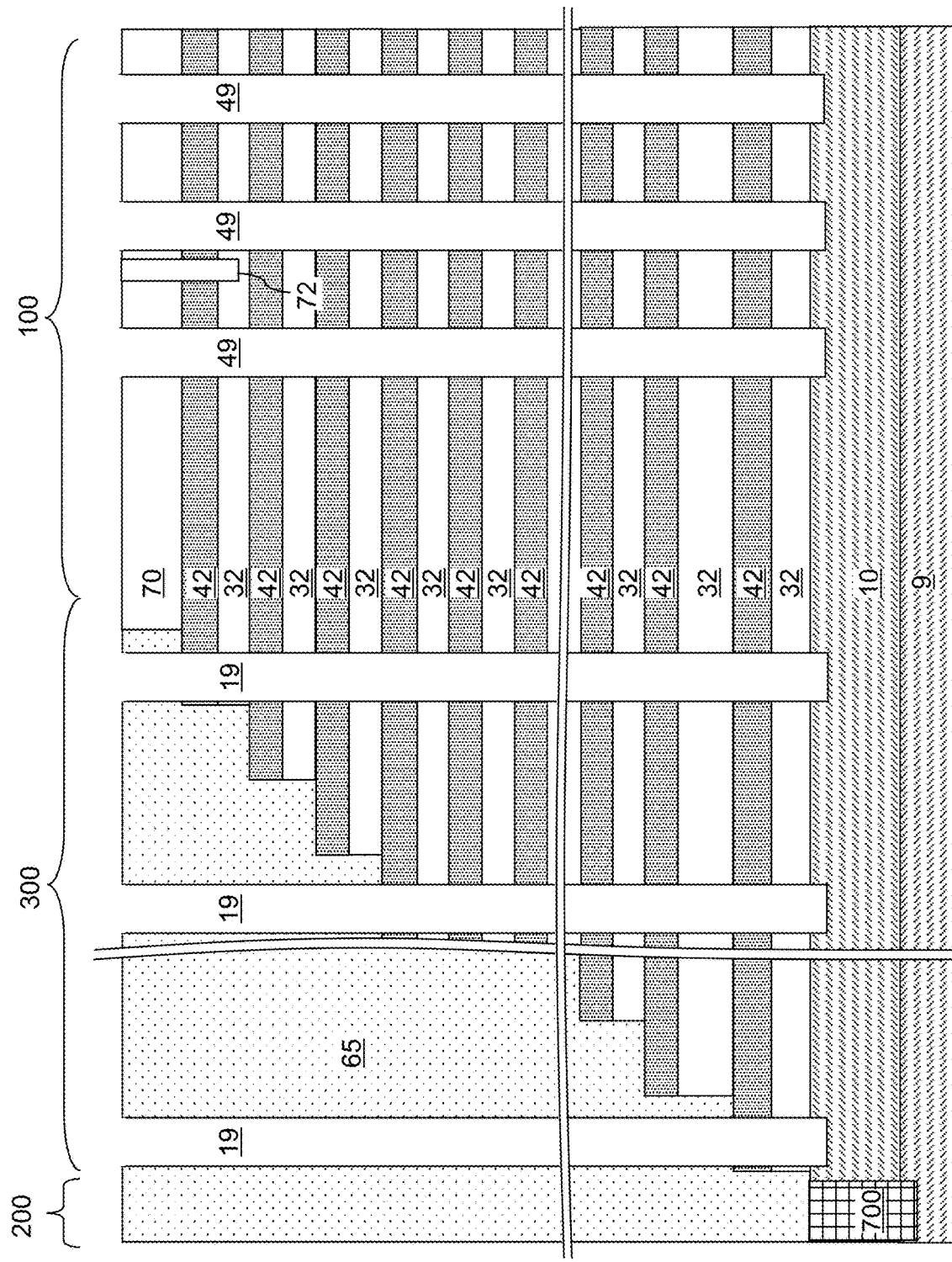
FIG. 4A is a schematic vertical cross-sectional view of the exemplary structure after formation of memory openings and support openings according to an embodiment of the present disclosure.
Figure 4B:
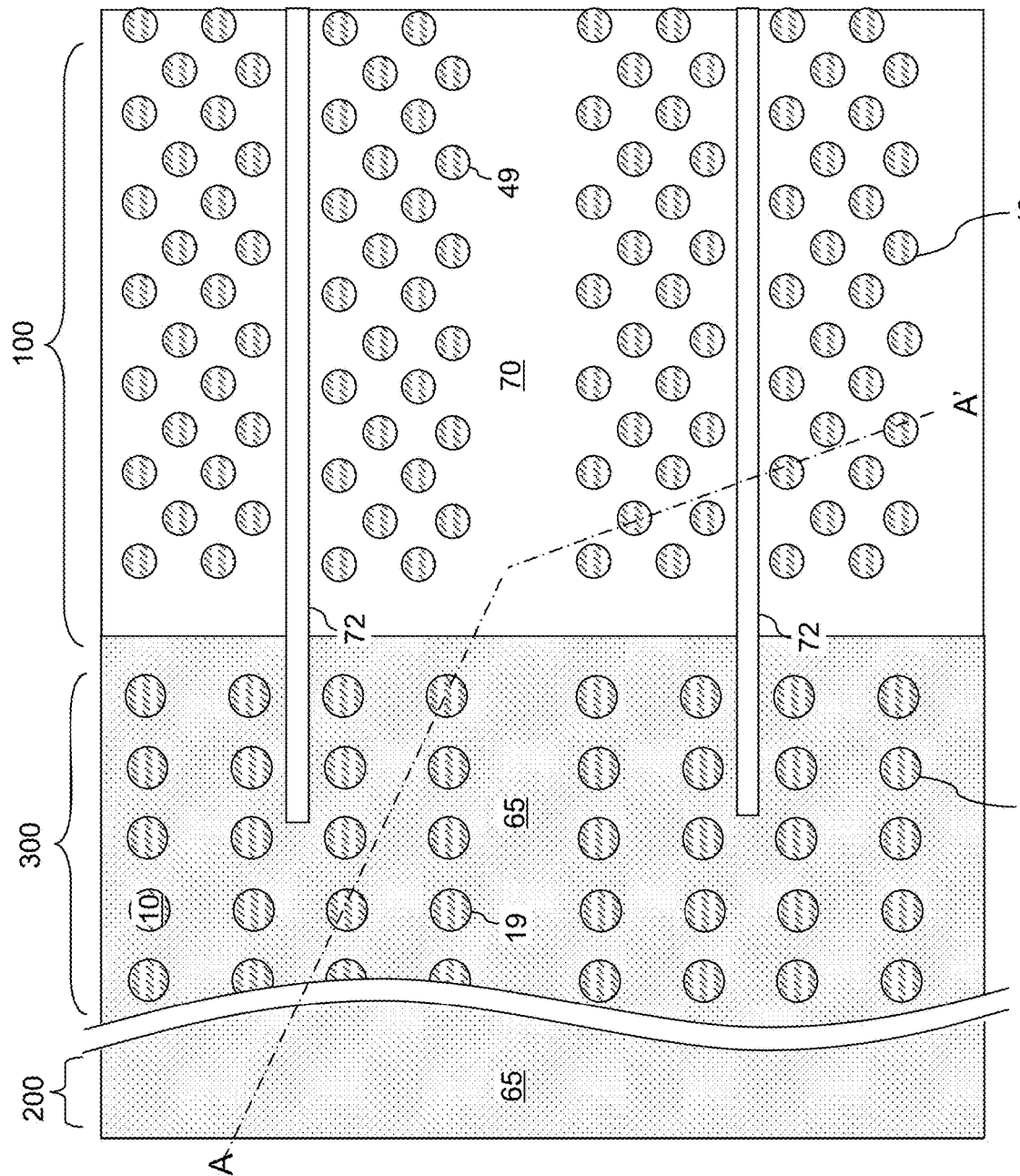
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
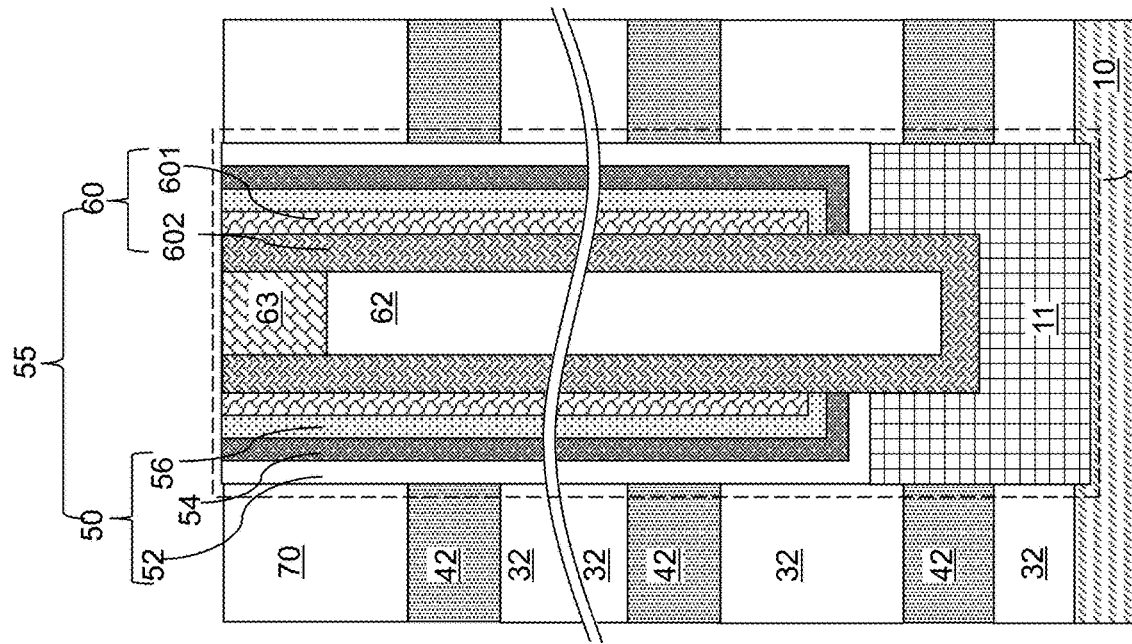

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
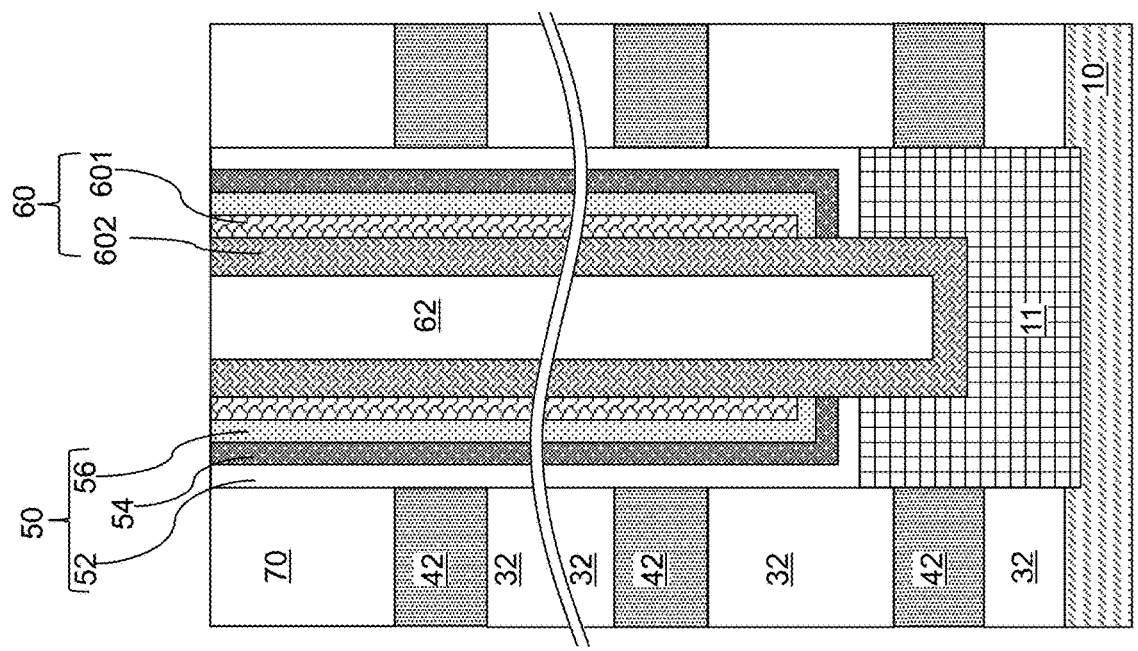

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
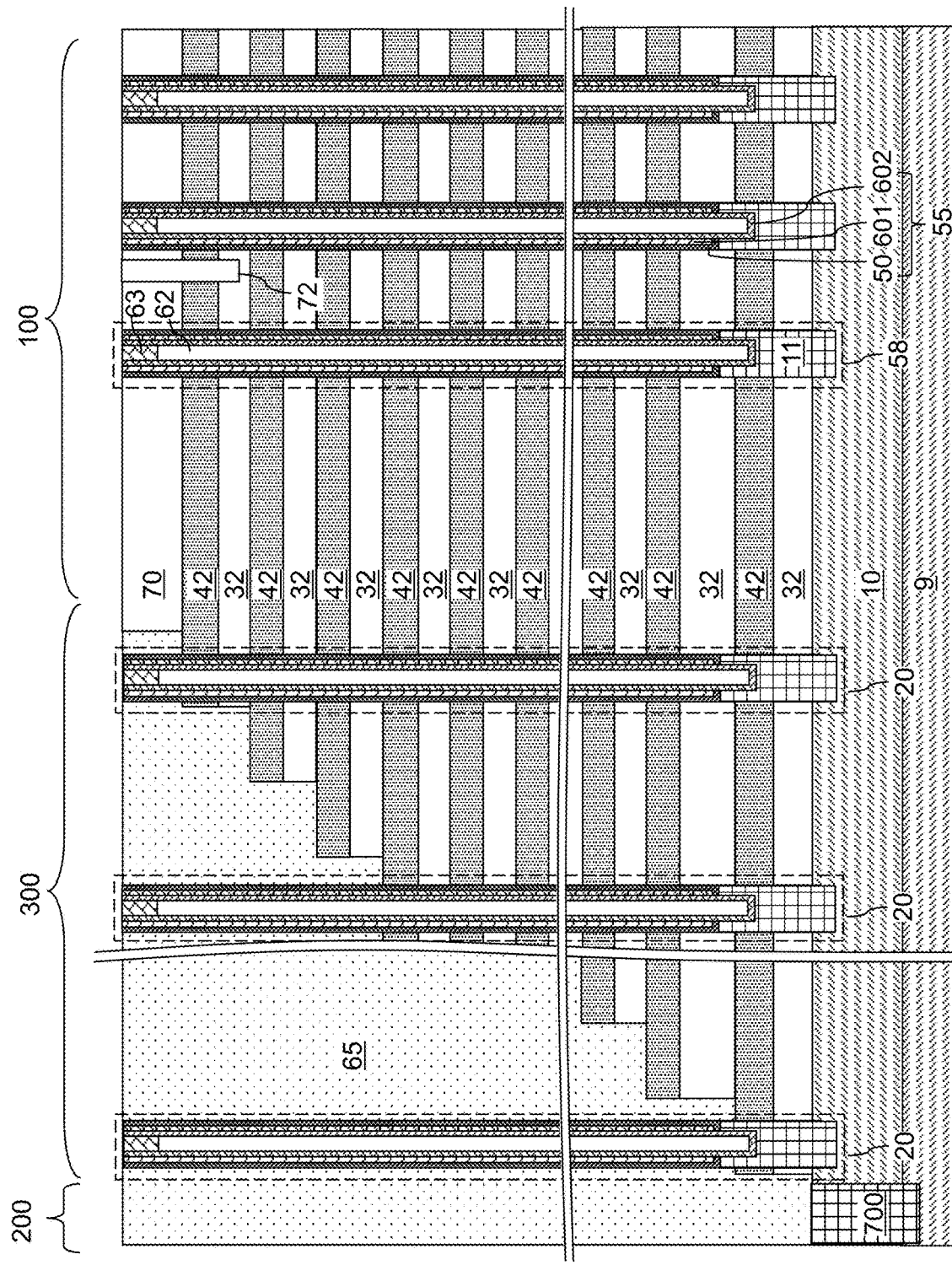
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. A two-dimensional array of memory stack structures 55 vertically extends through an alternating stack of insulating layers 32 and sacrificial material layers 42 that overlies a substrate (9, 10).

Each memory stack structure 55 includes a memory film 50 and a vertical semiconductor channel 60, which may comprise multiple semiconductor channel layers (601, 602) or a single semiconductor channel layer. The memory film 50 may comprise a tunneling dielectric layer 56 laterally surrounding the vertical semiconductor channel 60, a vertical stack of charge storage regions (e.g., comprising regions in the charge storage layer 54 that are located adjacent to a control gate electrode) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7:
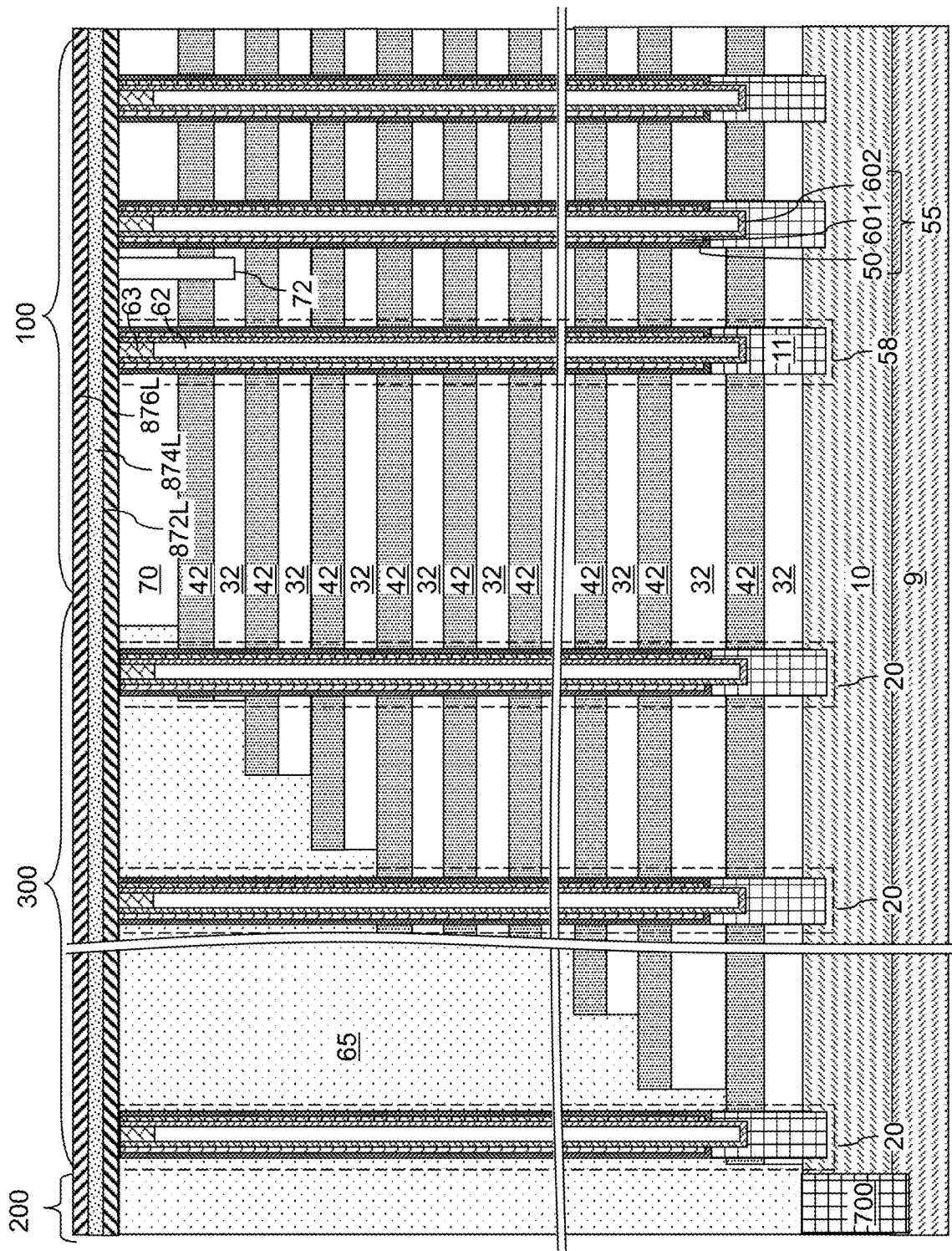
FIG. 7 is a schematic vertical cross-sectional view of the exemplary structure after formation of a layer stack including a bottom electrode layer, a memory material layer, and a top electrode layer according to an embodiment of the present disclosure.

Referring to FIG. 7, a layer stack including a bottom electrode layer 872L, a memory material layer 874L, and a top electrode layer 876L can be sequentially formed over the alternating stack (32, 42), the retro-stepped dielectric material portion 65, and the two-dimensional array of memory stack structures 55. The bottom electrode layer 872L can include a metallic material, which may include an elemental metal, a conductive metal nitride, and/or a metal silicide. In one embodiment, the bottom electrode layer 872L can consist essentially of at least one conductive metal nitride material such as TiN, TaN, WN, or a combination thereof, and/or at least one metal, such as W, Al, Pt, Pd, Cu, Ag, Ru, Ta or alloys thereof. In another embodiment, the bottom electrode layer 872L can include a metal silicide material as a continuous material layer, or can include a metal silicide material as discrete material portions only on physically exposed surfaces of the drain regions 63. In one embodiment, the discrete material portions of the metal silicide material may be formed by a silicidation process, i.e., a self-aligned silicidation process of the drain regions 63. The combination of the discrete metal silicide portions and a subsequently deposited metallic material layer (such as a TiN layer) can constitute the bottom electrode layer 872L. Alternatively, the continuous bottom electrode layer 872L may be replaced with discrete metal silicide portions or discrete conductive metal nitride portions. The thickness of the bottom electrode layer 872L can be in a range from 1 nm to 50 nm, such as from 3 nm to 20 nm, although lesser and greater thicknesses can also be employed.

The memory material layer 874L includes a non-volatile or volatile memory device material that can provide two distinct resistivity states depending on the history of a bias voltage thereacross. In one embodiment, the memory material layer 874L can include a material for a non-volatile resistive memory device, such as a resistive random access memory (ReRAM) device. For example, the memory material layer 874L for a non-volatile memory device can include a transition metal oxide material that provides different resistivity states through oxygen vacancy migration (such as hafnium oxide, tantalum oxide, tungsten oxide), a transition metal oxide material that functions as a reversible thermochemical fuse/antifuse (such as nickel oxide), an electrochemical migration-based programmable metallization material, which is also referred to as a conductive bridging or bridge material (such as copper-doped silicon dioxide glass, silver-doped germanium selenide, or silver-doped germanium sulfide), a tunnel barrier material, such as a Schottky tunnel barrier material (such as a memristor material, a barrier modulated cell/vacancy-modulated conductive oxide material (e.g., titanium oxide), or a praseodymium-calcium-manganese oxide (PCMO) material), a phase change memory material (such as a chalcogenide alloy, e.g., a germanium-antimony-telluride compound), a superlattice structure that exhibits multiple resistivity states through interfacial effects (such as a superlattice of chalcogenide alloys), a tunneling magnetoresistance material (such as a thin magnesium oxide tunneling layer located in a magnetic tunnel junction stack between ferromagnetic free and fixed (i.e., reference) layers, such as a stack of CoFeB/MgO/CoFeB layers), or a Mott transition-based metal-insulator transition (MIT) switching device material (such as vanadium oxide or niobium oxide). Alternatively, the memory material layer 874L may be a material for a volatile memory device, such as a volatile conductive bridge material for an atomic switch device. This device is similar to a conductive bridge device, except that the conductive bridge (i.e., the lower resistivity state) disappears when the external voltage application to the device is terminated. The volatile conductive bridge material may include silicon (for use with a silver electrode for silver conductive bridge formation) or a copper sulfide material for a copper conductive bridge formation. The thickness of the memory material layer 874L may be suitably selected, and may be in a range from 2 nm to 50 nm, such as from 5 nm to 20 nm, although lesser and greater thicknesses can also be employed.

Many inorganic and/or organic materials display thermal or ionic resistive switching effects. Non-limiting examples of such materials include phase-change chalcogenide materials such as $Ge_2Sb_2Te_5$ and AgInSbTe, binary transition metal oxide or oxynitride materials such as NiO, $TiO_x$, germanium oxide, zirconium oxide, aluminum oxide, aluminum oxynitride, etc., perovskite materials such as Sr(Zr)TiO$_3$ or PCMO, solid-state electrolytes such as GeS, GeSe, $SiO_x$ and $Cu_xS$, organic charge-transfer complexes such as CuTCNQ, organic donor-acceptor systems such as Al/AlDCN, and two dimensional (layered) insulating materials such as hexagonal boron nitride. The above materials may be stoichiometric or non-stoichiometric.

The top electrode layer 876L can include a metallic material, which may include an elemental metal, a conductive metal nitride, and/or a metal silicide. In one embodiment, the top electrode layer 876L can consist essentially of at least one conductive metal nitride material such as TiN, TaN, WN, or a combination thereof and/or at least one metal, such as W, Al, Pt, Pd, Cu, Ag, Ru, Ta or alloys thereof. In another embodiment, the top electrode layer 876L can include a metal silicide material as a continuous material layer. The thickness of the top electrode layer 876L can be in a range from 1 nm to 50 nm, such as from 3 nm to 20 nm, although lesser and greater thicknesses can also be employed. If the memory material layer 874L comprises a magnetoresistive tunneling material, such as MgO, then the bottom and top electrode layers may also include a ferroelectric alloy (e.g., CoFeB) free and fixed layers and an antiferromagnetic pinning layer for the fixed ferromagnetic layer to form the magnetic tunnel junction of an MRAM selector device in addition to the electrode materials described above, as will be described in more detail below. Likewise, the top and bottom electrodes may optionally include additional metal layers (e.g., silver) for forming a conductive bridge structure.

Figure 8A:
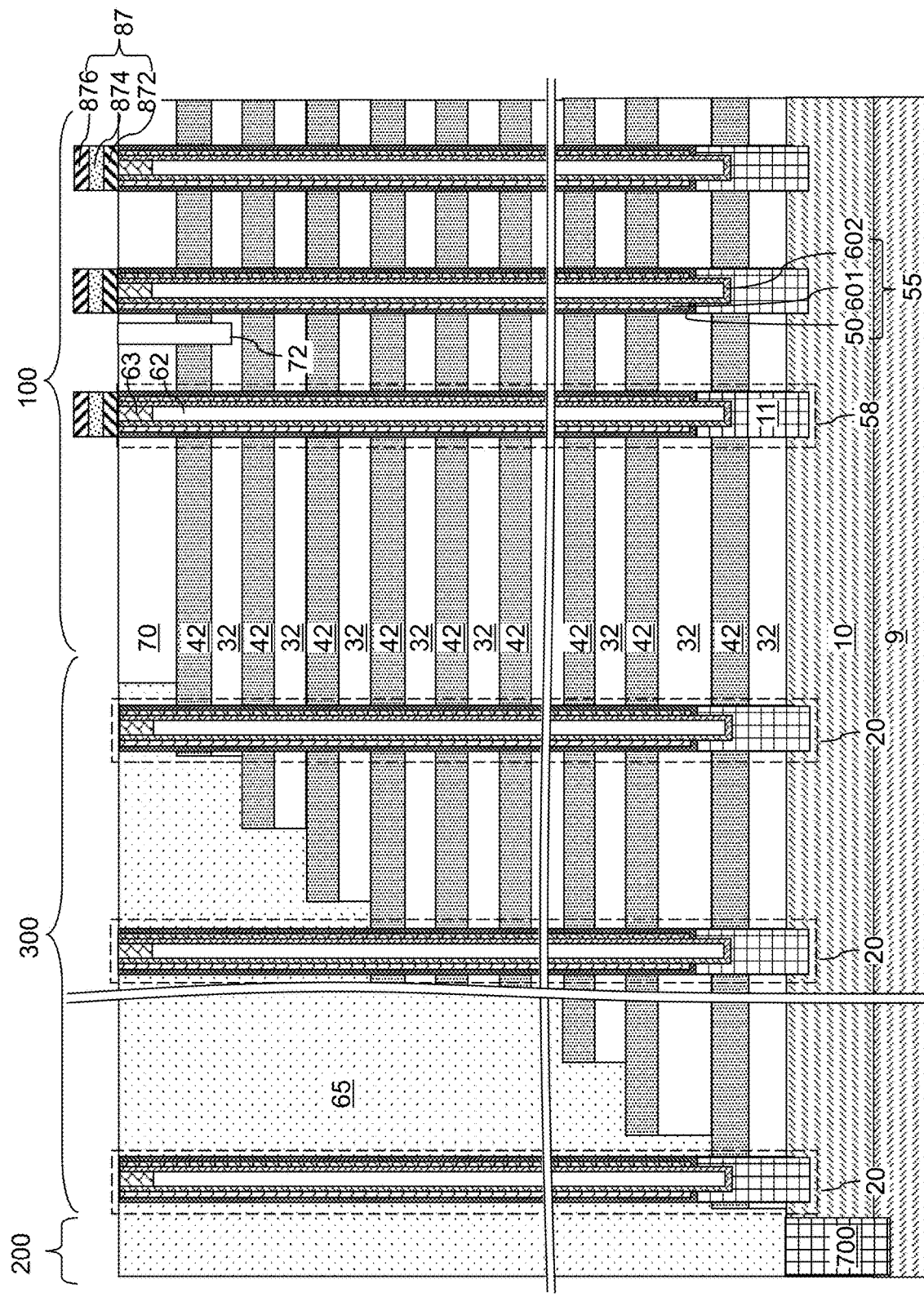
FIG. 8A is a schematic vertical cross-sectional view of the exemplary structure after formation of a two-dimensional array of selector elements according to an embodiment of the present disclosure.
Figure 8B:
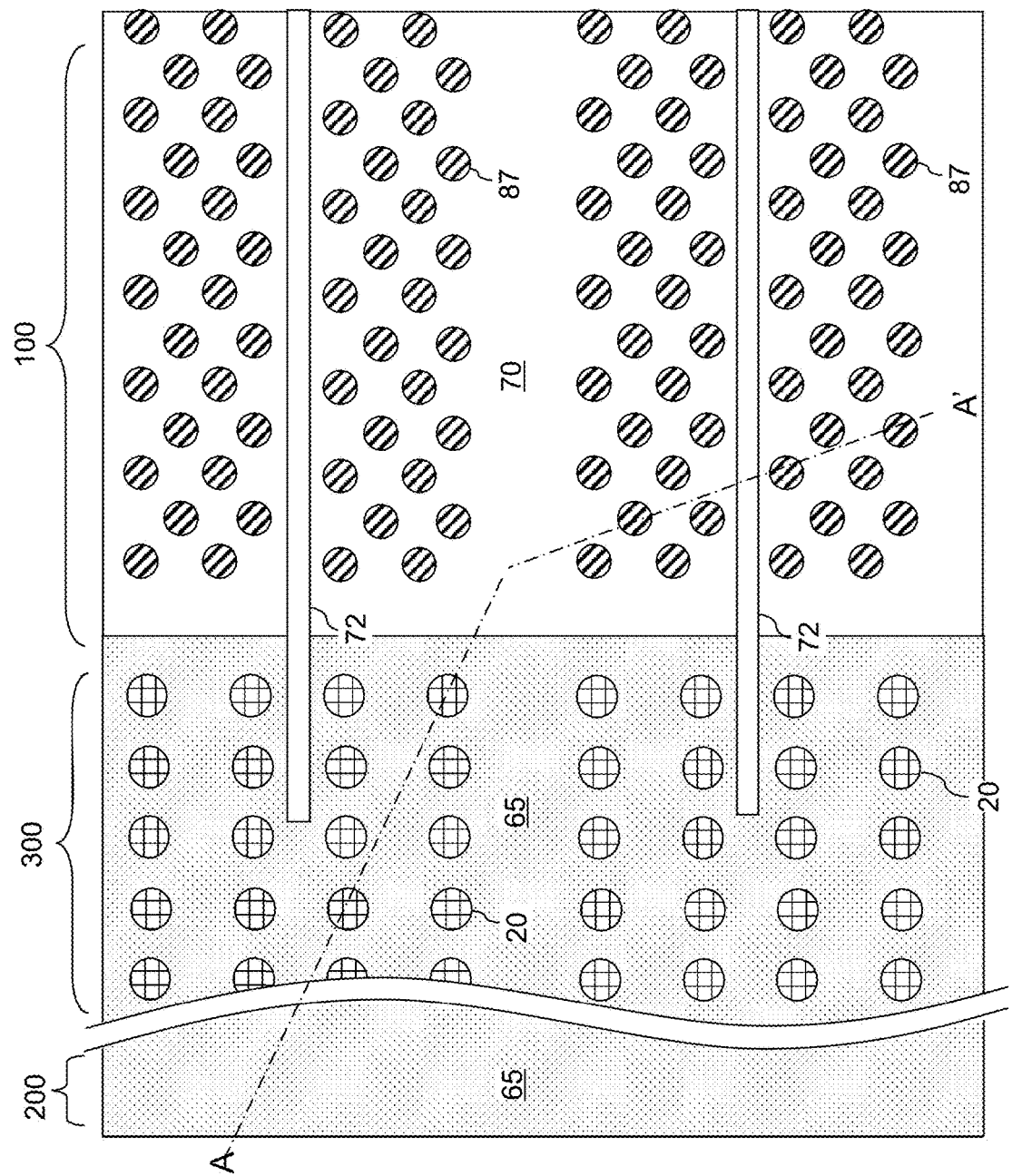
FIG. 8B is a top-down view of the exemplary structure of FIG. 8A. The vertical plane A-A' is the plane of the cross-section for FIG. 8A.

Referring to FIGS. 8A and 8B, a photoresist layer can be applied over the layer stack (872L, 874L, 876L), and can be lithographically patterned to form discrete patterned photoresist material portions that overlie a respective one of the memory opening fill structures 58. The patterned of the discrete patterned photoresist material portions can be transferred through the layer stack (872L, 874L, 876L) by an anisotropic etch process that employs the discrete patterned photoresist material portions as an etch mask. The anisotropic etch process etches through each layer within the layer stack (872L, 874L, 876L). The layer stack (872L, 874L, 876L) can be patterned into the two-dimensional array of selector elements 87. The discrete patterned photoresist material portions can be subsequently removed, for example, by an ashing process.

Each selector element 87 includes a vertical stack of a bottom electrode 872, a memory element 874, and a top electrode 876. Each bottom electrode 872 is a patterned portion of the bottom electrode layer 872L. Each memory element 874 is a patterned portion of the memory material layer 874L. Each top electrode 876 is a patterned portion of the top electrode layer 876L. A two-dimensional array of selector elements 87 is formed over the two-dimensional array of memory stack structures 55. The combination of the two-dimensional array of selector elements 87 and the two-dimensional array of memory stack structures 55 forms a two-dimensional array of series connections of a memory stack structure 55 and a selector element 87. Each of the selector elements 87 is a two terminal device configured to provide a lower resistivity state and a higher resistivity state based on the bias voltage and/or current thereacross (or a history thereof).

Generally, a plurality of series connections of a memory stack structure 55 and a selector element 87 can be formed. Each of the memory stack structures 55 extends through the alternating stack of insulating layers 32 and sacrificial material layers 42, and includes a respective memory film 50 and a respective vertical semiconductor channel 60. Each bottom electrode 872 of a selector element 87 can be electrically connected to a respective one of the vertical semiconductor channels 60 through a respective drain region 63. In one embodiment, the respective drain region 63 contacts the bottom electrode 872 and the respective one of the vertical semiconductor channels 60. In one embodiment, the selector element 874 has a pillar structure with a uniform horizontal cross-sectional shape that is invariant with translation of a horizontal cross-sectional plane along a vertical direction. While each of the selector elements 87 is shown in FIGS. 8A and 8B as having a pillar shape with a circular horizontal cross sectional shape as an example, it should be understood that the selector elements 87 may have any other suitable shape, as will be described in more detail below.

Generally, each memory element 874 can include any material that can be employed for the memory material layer 874L. In one embodiment, each memory element 874 can comprise a ReRAM type metal oxide material which forms and disrupts conductive filaments therein due to vacancy migration or metal migration (e.g., antifuse formation) in response to an application of an applied electrical field thereacross. In one embodiment, each memory element 874 can comprise a barrier material cell/vacancy-modulated memory element that provides a variable density of oxygen vacancies within a metal oxide material (e.g., titanium oxide) to create and remove an electron tunneling barrier depending on a direction and a magnitude of an applied electrical field thereacross. In one embodiment, each memory element 874 can comprise a conductive bridge memory element that provides a variable density of conductive filaments within the memory element 874 depending on a direction and magnitude of an applied electrical field thereacross. In one embodiment, each memory element 874 can comprise a phase change memory element that provides at least two different resistivity states depending on crystallinity or lack thereof (e.g., transition between amorphous and crystalline phases) of a phase change material. In one embodiment, each memory element 874 can comprise a spin-torque-transfer (STT) magnetic memory (e.g., STT-MRAM) element containing a magnetic tunneling junction (MTJ) that provides at least two different resistivity states depending on alignment of a direction of magnetization of a reference layer therein and a direction of magnetization of a free layer therein.

Figure 9A:
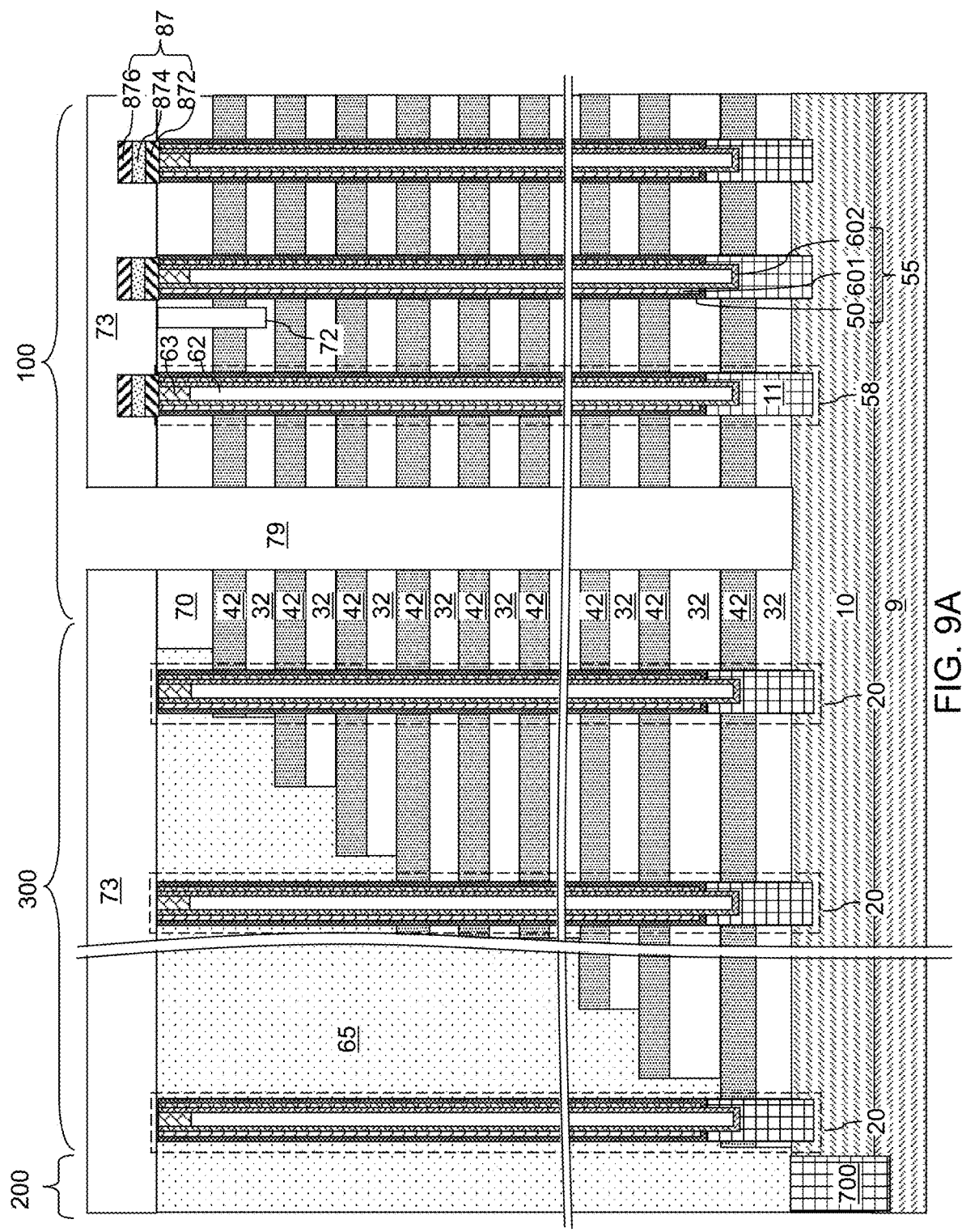
FIG. 9A is a schematic vertical cross-sectional view of the exemplary structure after formation of backside trenches according to an embodiment of the present disclosure.

Referring to FIGS. 9A and 9B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The top surface of the contact level dielectric layer 73 may be optionally planarized by a planarization process such as chemical mechanical planarization. The contact level dielectric layer 73 can have a thickness (as measured between a topmost surface and a bottommost surface along a vertical direction) that is greater than the height of each selector element 87. The thickness of the contact level dielectric layer 73 may be in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 (e.g., word line direction) and can be laterally spaced apart among one another along a second horizontal direction hd2 (e.g., bit line direction) that is perpendicular to the first horizontal direction hd1. The memory stack structures 55 can be arranged in rows that extend along the first horizontal direction hd1. Each set of memory stack structures 55 located between neighboring backside trenches 79 can be considered a memory block. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 10:
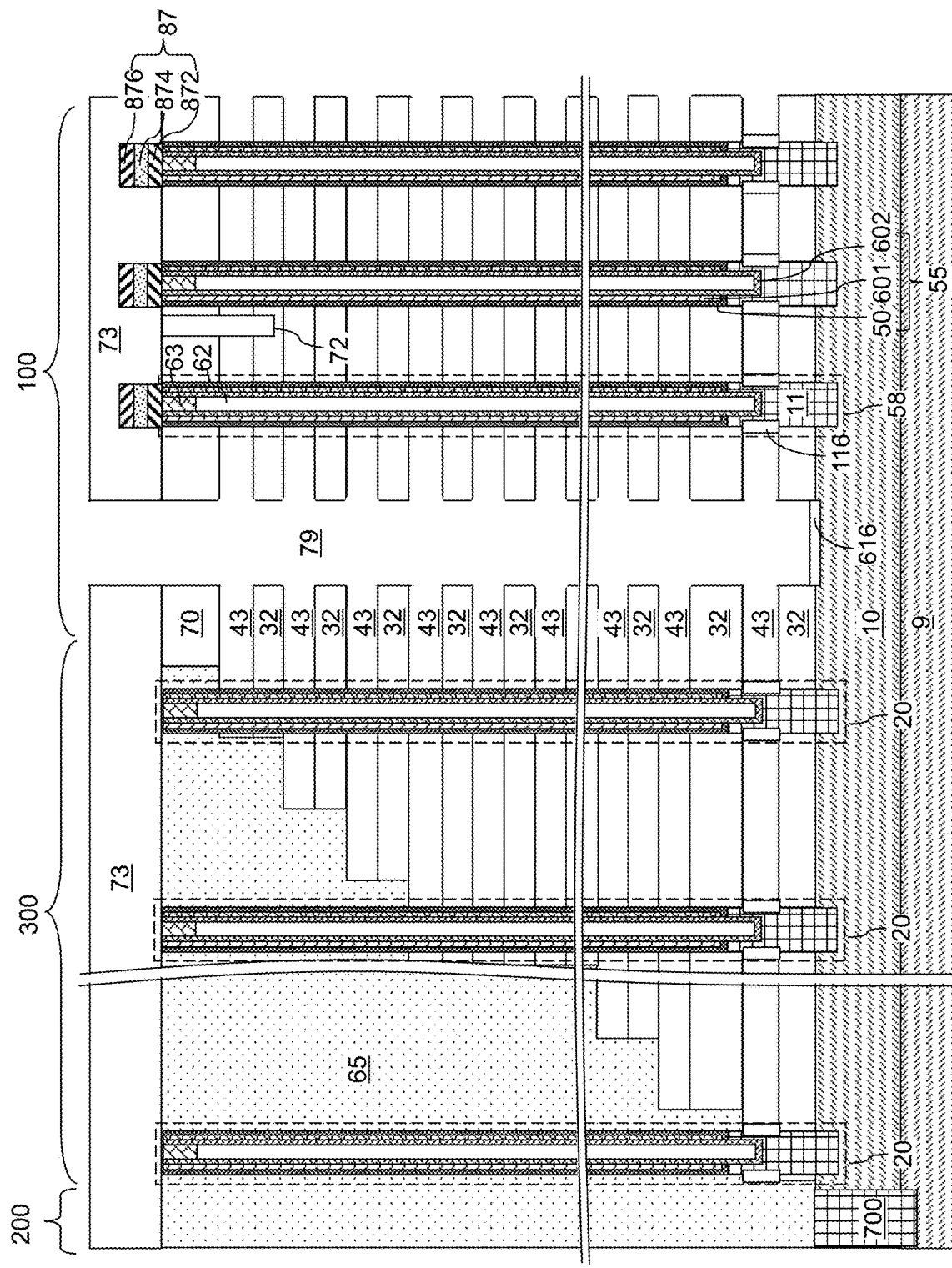
FIG. 10 is a schematic vertical cross-sectional view of the exemplary structure after formation of backside recesses according to an embodiment of the present disclosure.

Referring to FIGS. 10 and 11A, an etchant that selectively etches the second material of the sacrificial material layers 42 with respect to the first material of the insulating layers 32 can be introduced into the backside trenches 79, for example, employing an etch process. FIG. 11A illustrates a region of the exemplary structure of FIG. 10. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 11B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 11C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 12:
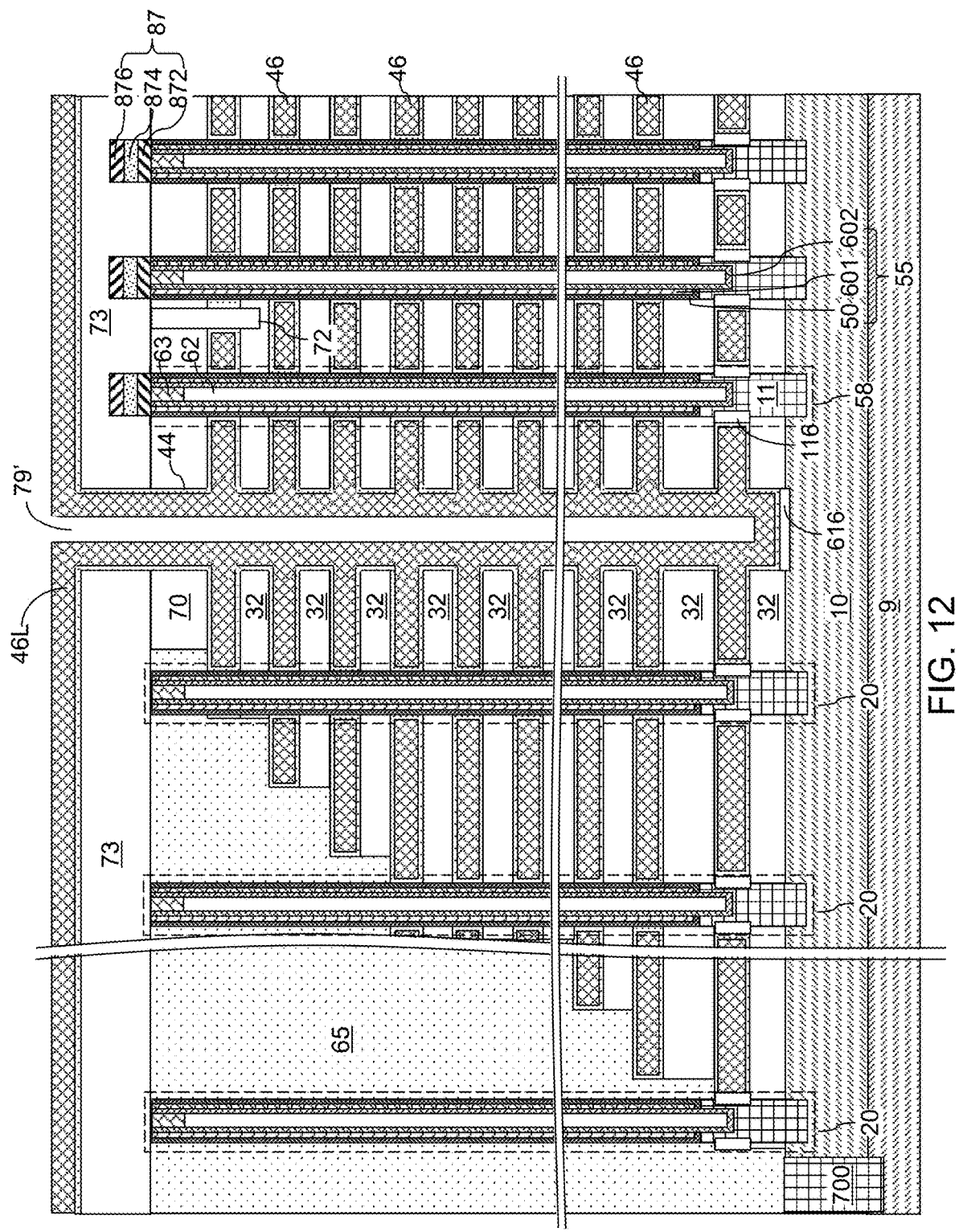
FIG. 12 is a schematic vertical cross-sectional view of the exemplary structure at the processing step of FIG. 11D.

Referring to FIGS. 11D and 12, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 13A:
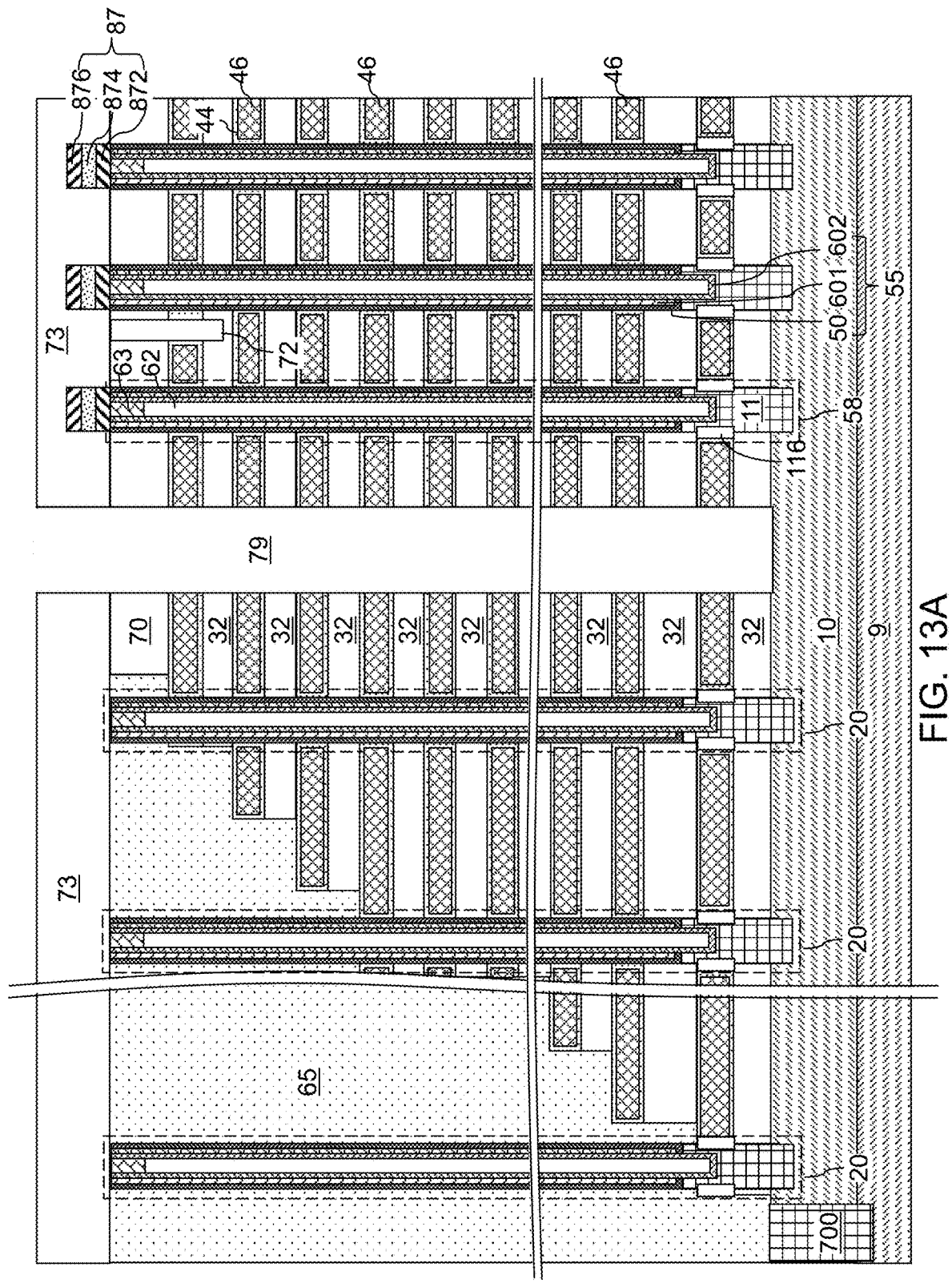
FIG. 13A is a schematic vertical cross-sectional view of the exemplary structure after removal of a deposited conductive material from within the backside trench according to an embodiment of the present disclosure.
Figure 13B:
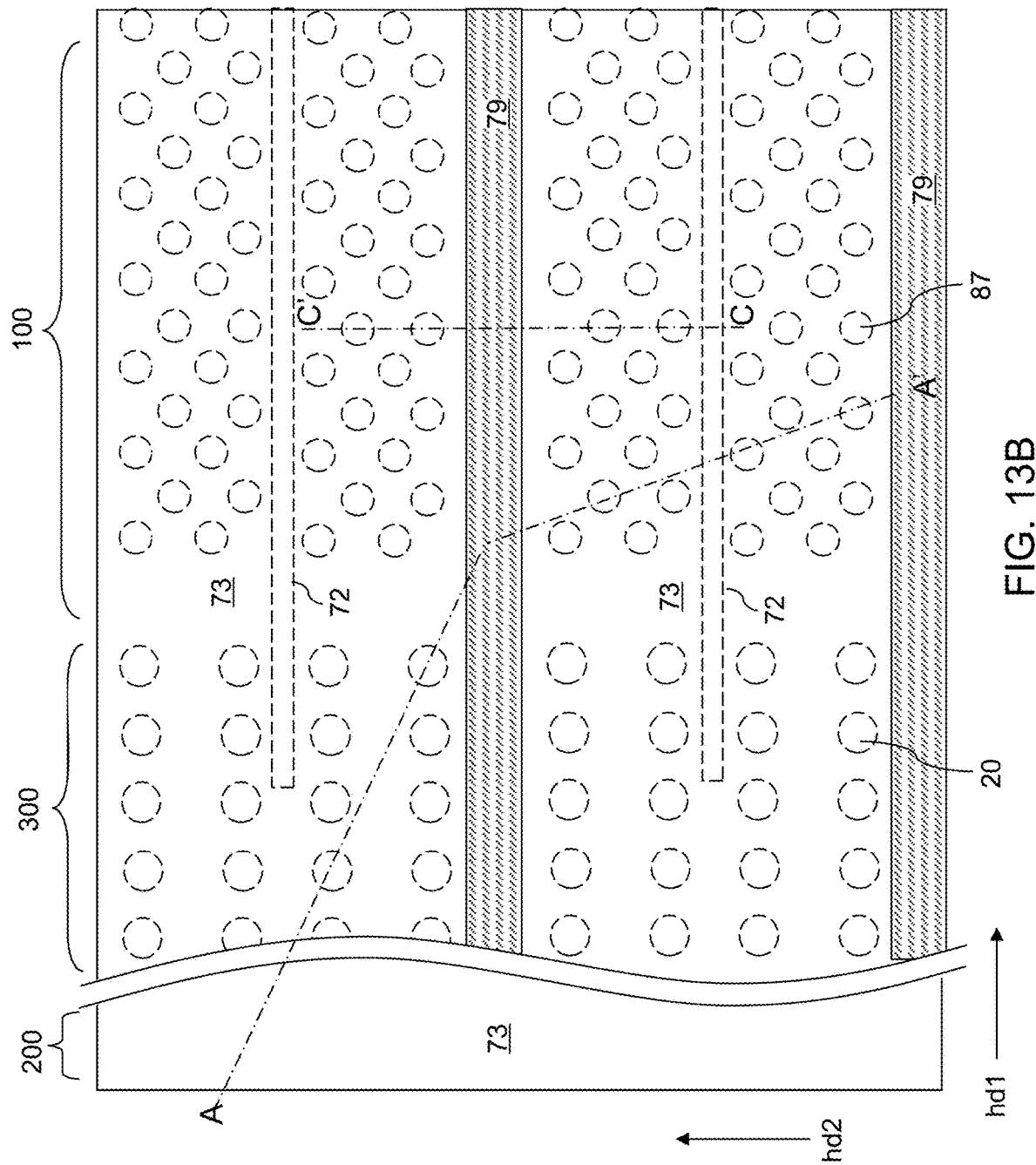
FIG. 13B is a partial see-through top-down view of the exemplary structure of FIG. 13A. The vertical plane A-A' is the plane of the schematic vertical cross-sectional view of FIG. 13A.
Figure 13C:
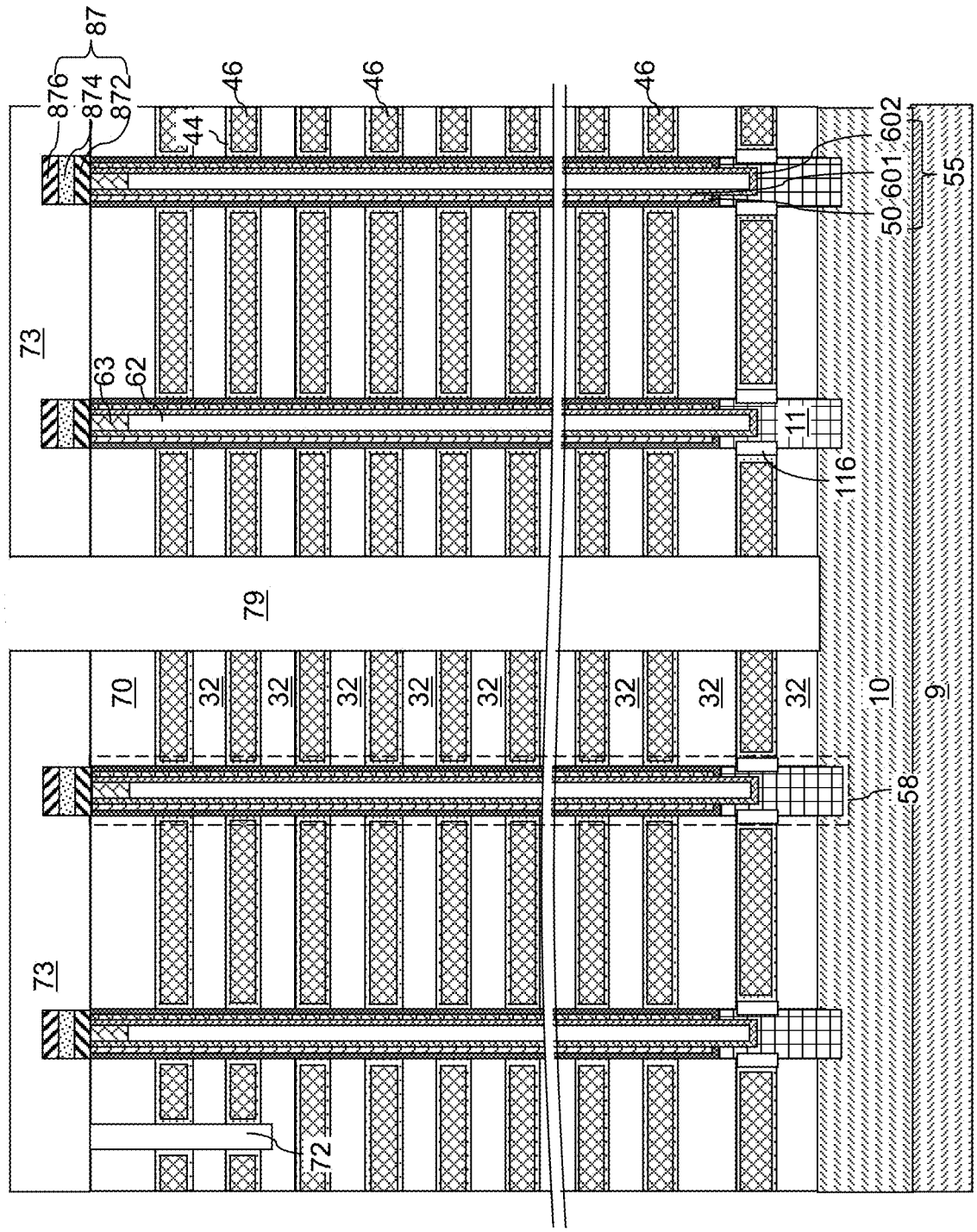
FIG. 13C is a vertical cross-sectional view of the exemplary structure along the vertical plane C-C' of FIG. 13B.

Referring to FIGS. 13A-13C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 14A:
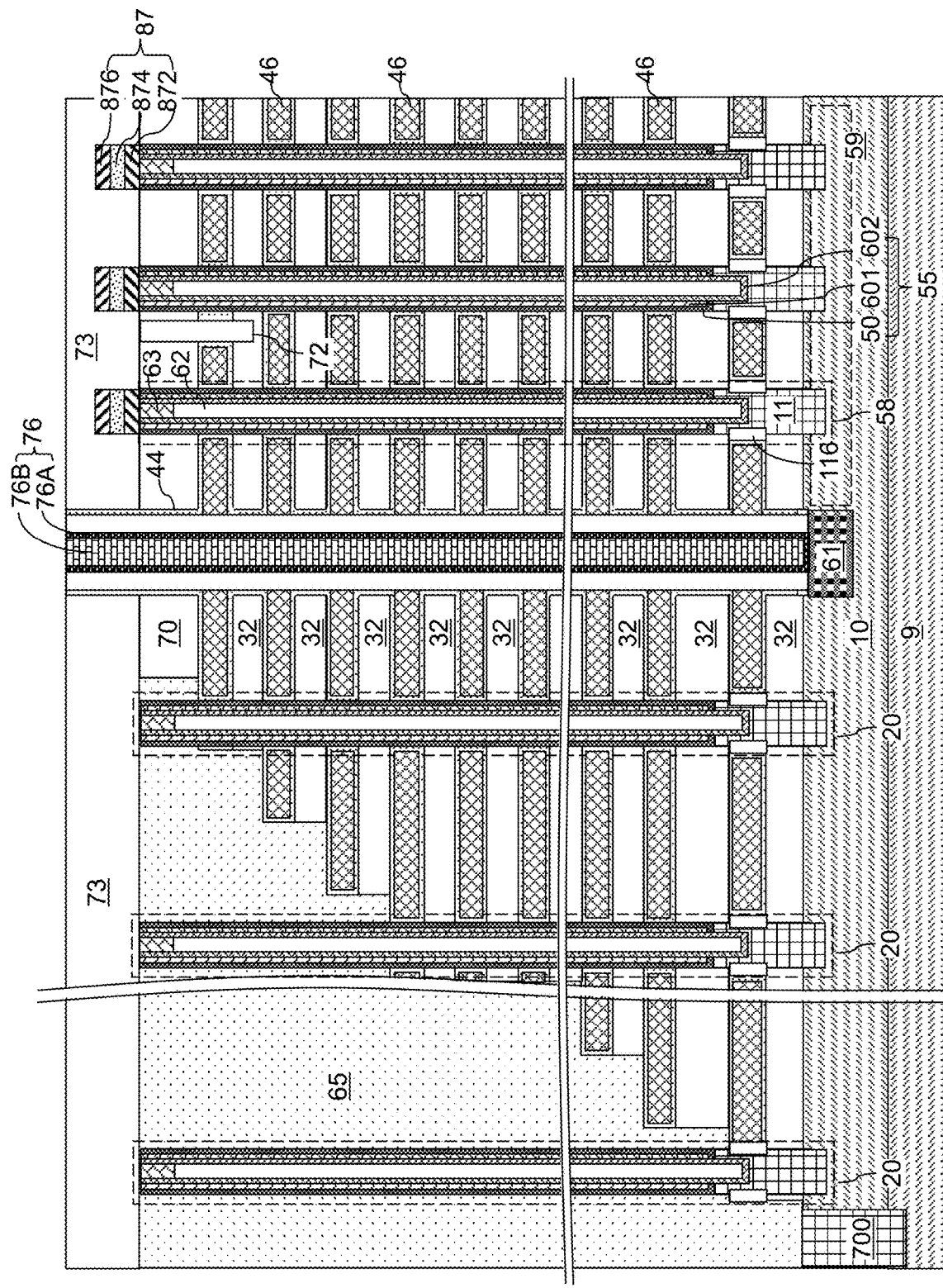
FIG. 14A is a schematic vertical cross-sectional view of the exemplary structure after formation of an insulating spacer and a backside contact structure according to an embodiment of the present disclosure.

Referring to FIGS. 14A and 14B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An optional anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

In an alternative embodiment, the optional anisotropic etch which removes horizontal portions of the insulating material layer is omitted and the insulating material layer completely fills the backside trenches 79. In this embodiment, the horizontal semiconductor channel 59, the source region 61 and the backside contact via structures 76 are omitted. Instead, a horizontal source line is formed between the substrate (9, 10) and the alternating stack (32, 42). The horizontal source line contacts a sidewall of each vertical channel 60 exposed in an opening in the memory film 50 below the alternating stack (32, 42).

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 15A:
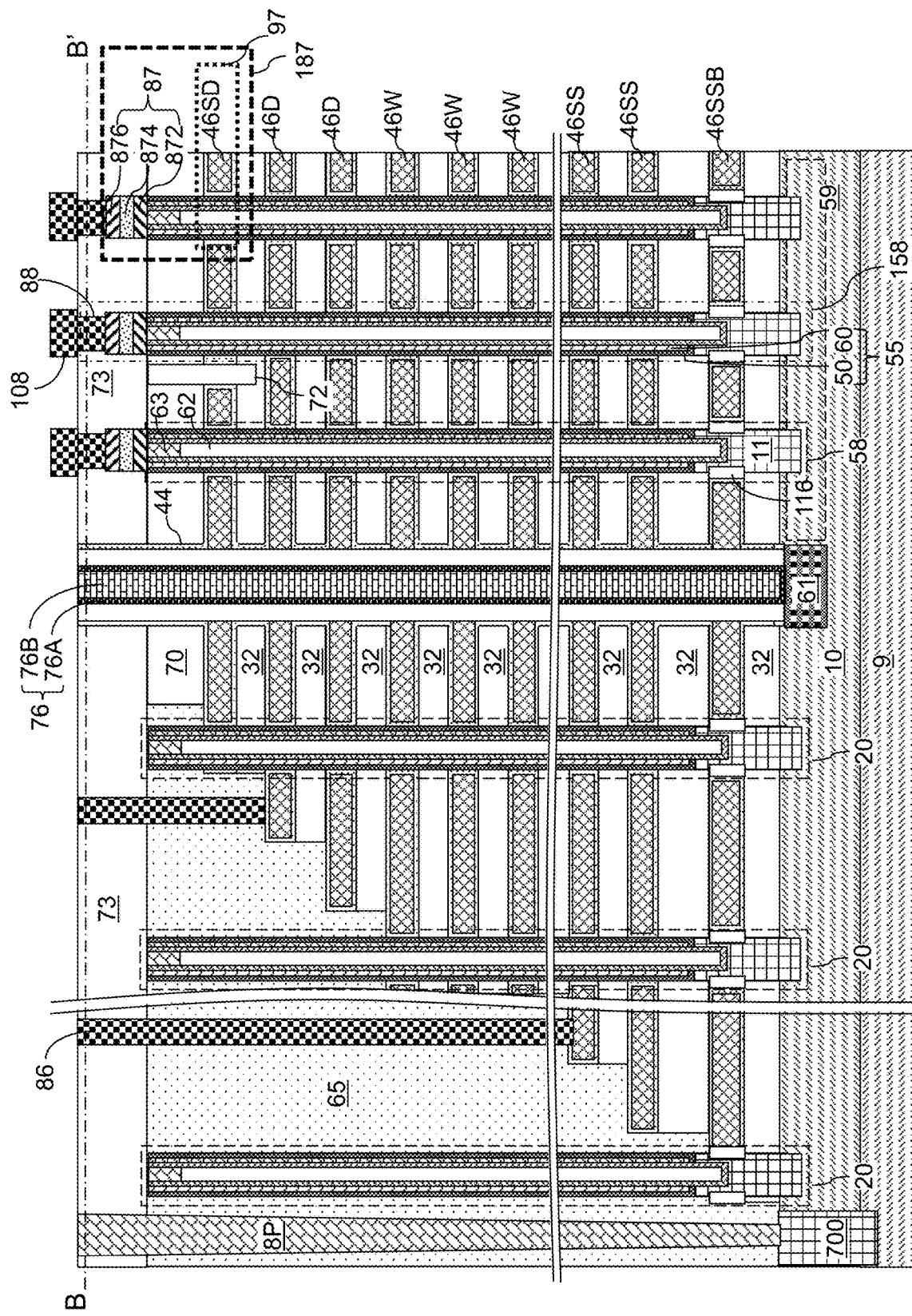
FIG. 15A is a schematic vertical cross-sectional view of the exemplary structure after formation of additional contact via structures according to an embodiment of the present disclosure.
Figure 15B:
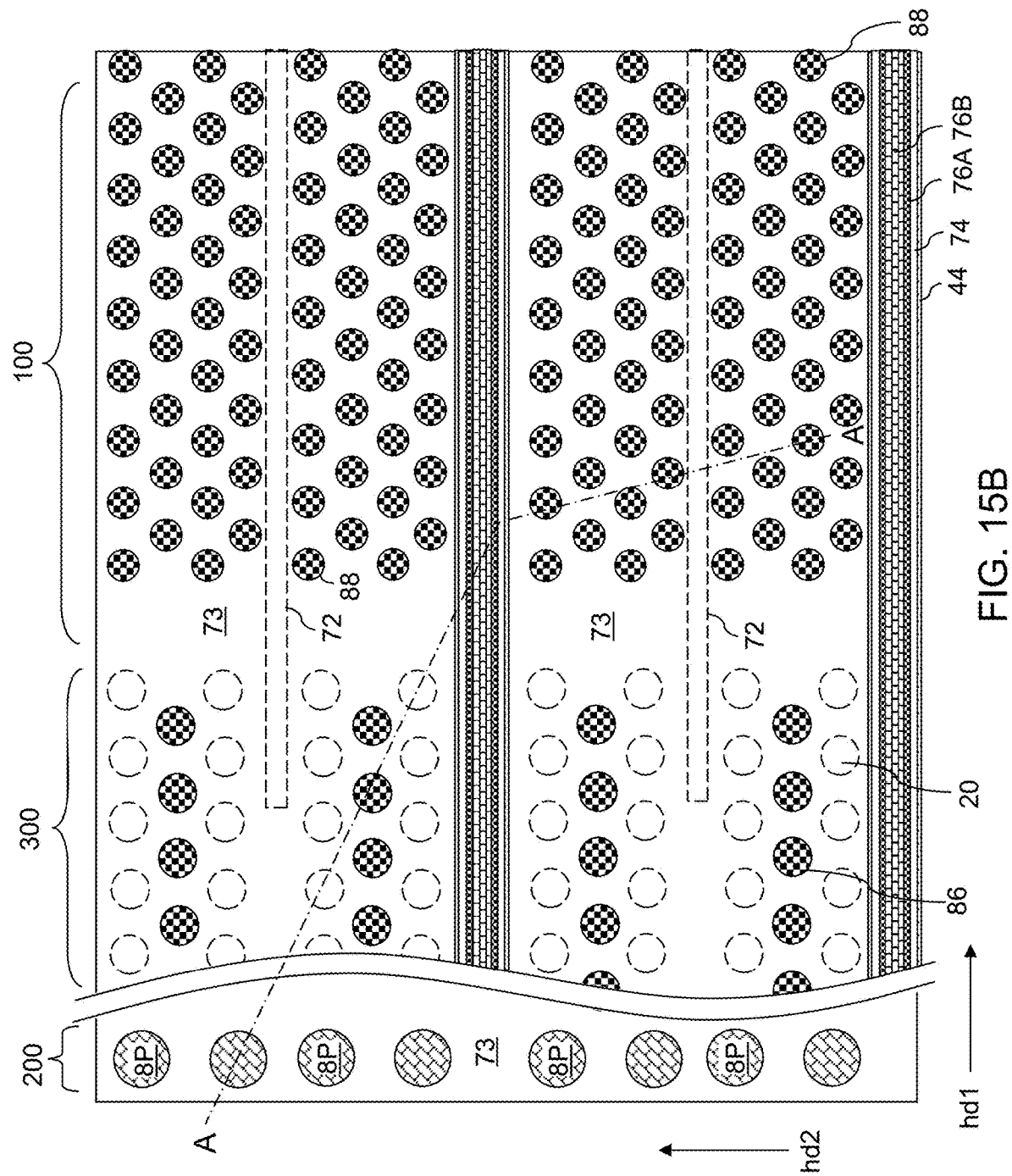
FIG. 15B is a horizontal cross-sectional view of the exemplary structure of FIG. 15A along horizontal plane B-B'. The vertical plane A-A' is the plane of the schematic vertical cross-sectional view of FIG. 15A.
Figure 16:
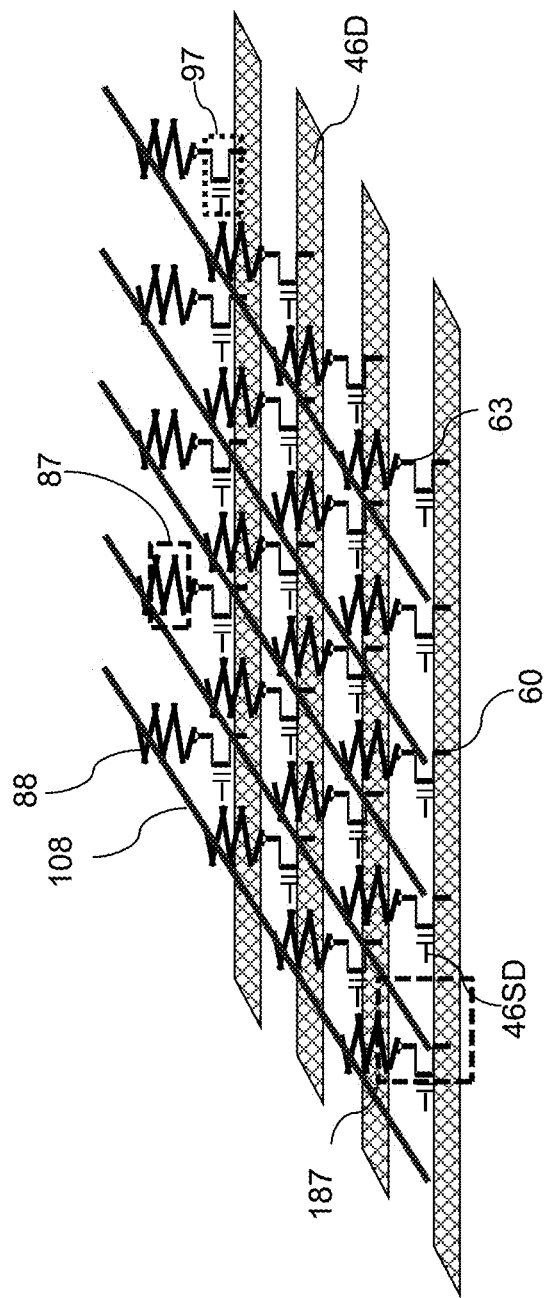
FIG. 16 is a schematic circuit diagram for a two-dimensional array of selector elements according to an embodiment of the present disclosure.

Referring to FIGS. 15A and 15B, additional contact via structures (88, 86, 8P) can be formed through the contact level dielectric layer 73, and optionally through the retro-stepped dielectric material portion 65. For example, bit line connection via structures 88 can be formed through the contact level dielectric layer 73 on each selector element 87. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. Each via structure, such as the bit line connection via structure 88, may comprise one or more via segments. However, the via structures are shown as having only one segment in FIG. 15A for simplicity.

Referring to FIGS. 15A, 15B, 16 and 17, bit lines 108 can be formed directly on top surfaces of a respective subset of the bit line connection via structures 88. Each bit line 108 can be formed on a column of bit line connection via structures 88 that are arranged along the second horizontal direction hd2 (i.e., bit line direction). The topmost electrically conductive layer 46 can comprise drain select electrodes (i.e., SGD gate electrodes) 46SD. In this case, the topmost electrically conductive layer 46SD can be divided into multiple fingers (46F0, 46F1, 46F2, 46F3) along the second horizontal direction hd2 by the drain-select-level isolation structures 72 and the backside trenches 79 that laterally extend along the first horizontal direction hd1. Each bit line 108 can be electrically connected to only one vertical memory string 158 which comprises a series connection of a selector element 87 and a memory stack structure 55 per finger of the topmost electrically conductive layer 46SD. The selector element 87 can be a two terminal memory device, such as a two terminal memory device that has at least two different resistivity states. The selector device 187 for each vertical NAND string can be represented by a combination of a resistor (i.e., two terminal selector element 87) and a three terminal transistor switch, such as a drain select transistor 97 comprising the drain select gate electrode 46SD, a portion of the memory film 50 (which acts as a gate dielectric of the drain select transistor), and vertical semiconductor channel 60 located adjacent to the drain select gate electrode 46SD.

In addition to the drain select electrodes 46SD, the electrically conductive layers 46 can also include word lines 46W and optional dummy words lines 46D that are located adjacent to dummy memory cells (e.g., upper and lower parts of the charge storage layer 54) that not employed to store data. One or more drain side dummy word lines 46D may be located between the word lines 46W and the drain select electrode 46SD. One or more source side dummy word lines 46D (not shown for clarity in FIG. 15A but shown in FIG. 21A) may be located between the word lines 46W and the source select electrode(s) 46SS. If desired, there may be plural source select electrodes 46SS that are electrically connected to each other and an additional bottom source select electrode 46SSB that is not electrically connected to electrodes 46SS and may be activated separately from the electrodes 46SS.

Figure 17:
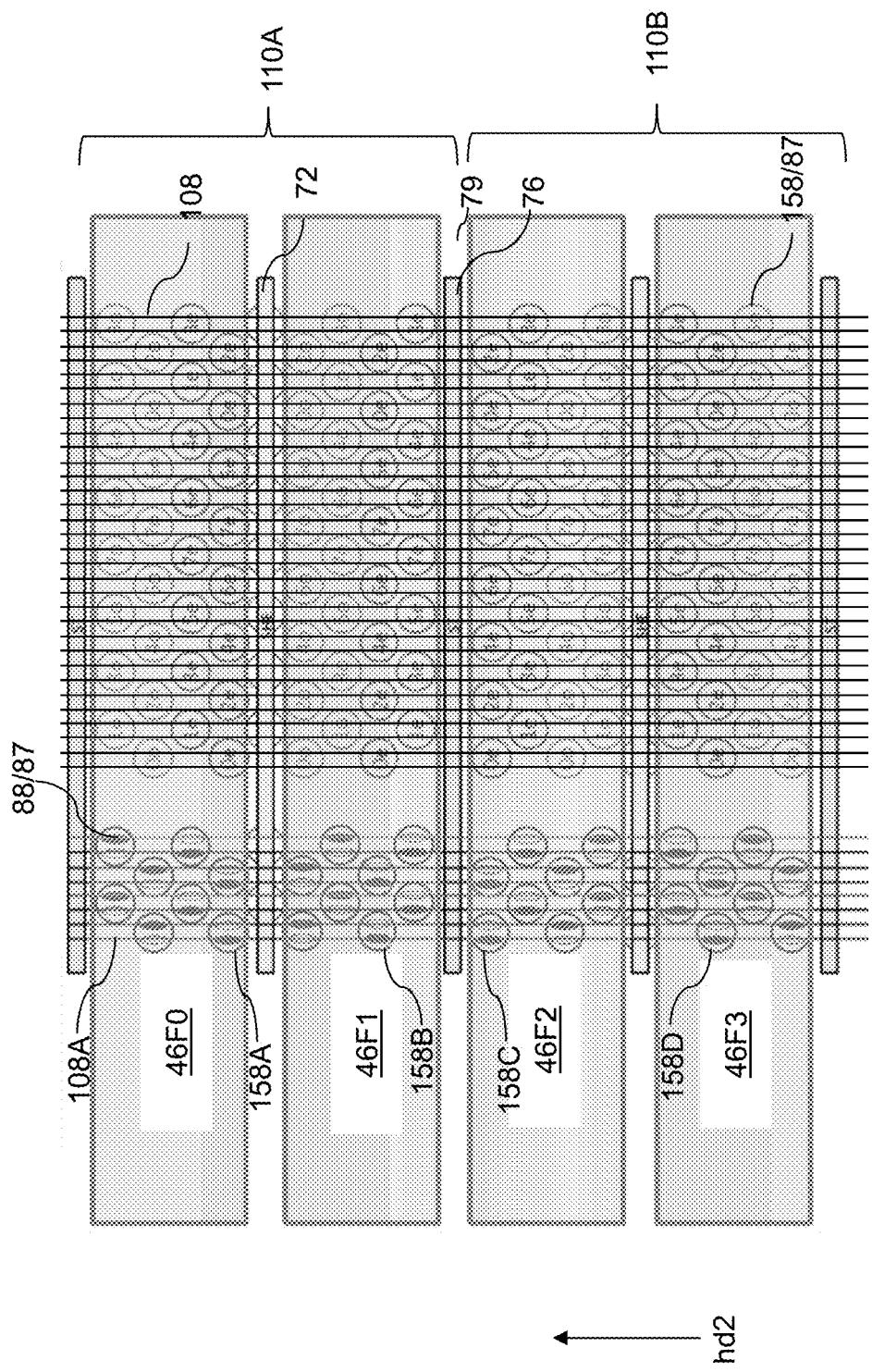
FIG. 17 is a schematic top-down view of the exemplary structure of FIGS. 15A and 15B after formation of connection vias and bit lines according to an embodiment of the present disclosure.

In one embodiment, the bit lines 108 are formed over the two-dimensional array of selector elements 87 of the selector devices 187 and the bit lines 108 are electrically connected to sense amplifiers of the peripheral circuit. In one embodiment, the plurality of bit lines 108 are laterally spaced apart along a first horizontal direction hd1, laterally extend along a second horizontal direction hd2, and are electrically connected to top ends of a respective column of vertical NAND strings 158 that extends along the second horizontal direction hd2 across plural memory blocks. In one embodiment, each of the bit lines 108 can be electrically connected to a respective first and second vertical memory strings (158A, 158B) located in a first memory block 110A and respective third and fourth vertical memory strings (158C, 158D) located in a second memory block 110B. Different drain select electrode 46SD fingers 46F0, 46F1, 46F2 and 46F3 surround each respective first, second, third and fourth vertical memory strings (158A, 158B, 158C, 158D). The vertical memory strings 158 are numbered with odd "o" or even "e" numbers, such that there are for example four rows of strings 158 (two odd and two even) surrounded by each finger, and each bit line 108 is electrically connected to the same numbered string (e.g., the bit line 108A in FIG. 17 is electrically connected to four "zero odd" ("0o") strings (158A-158D) in two blocks 110A, 110B).

Figures 18A, 18B:
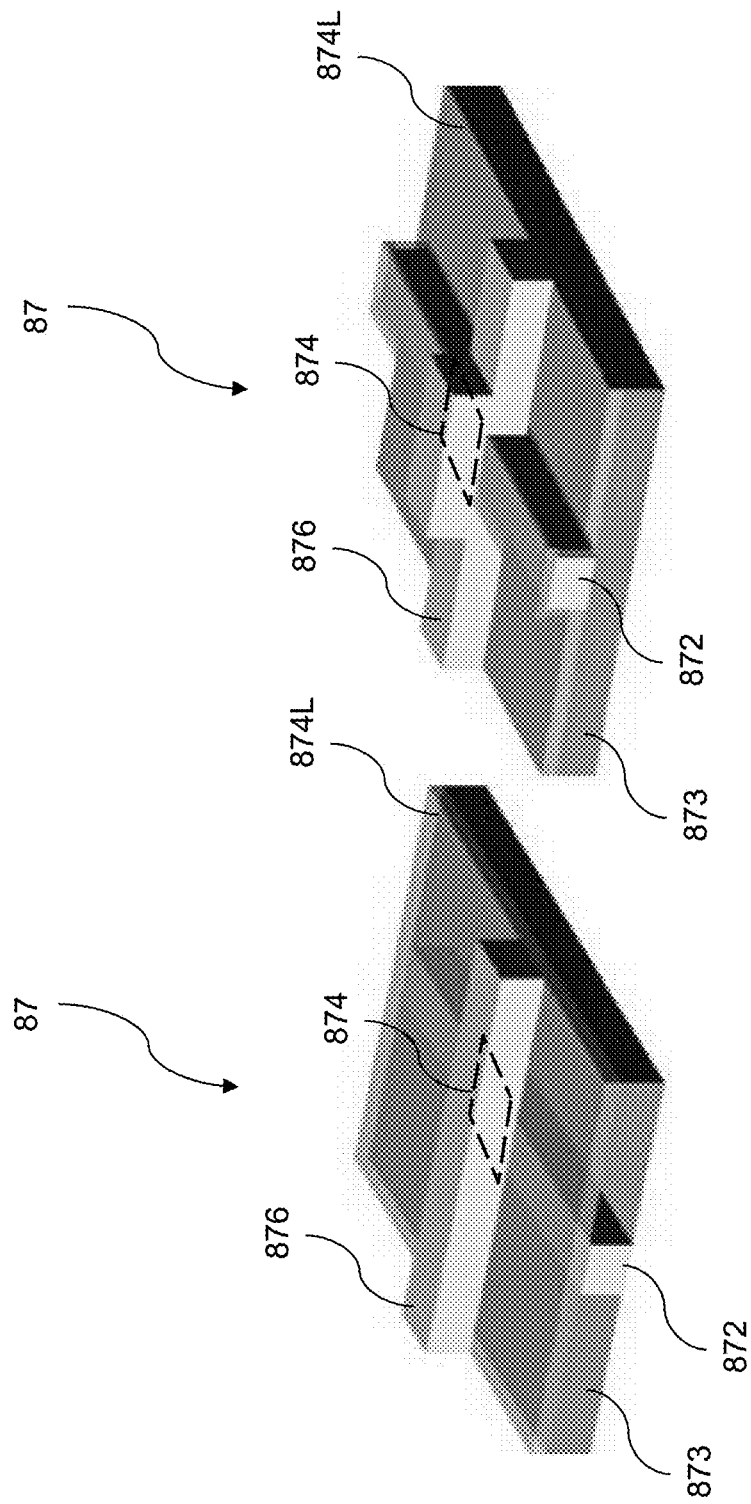
FIG. 18A is a perspective view of a first alternative configuration of a selector element employing a pair of access lines according to an embodiment of the present disclosure.
FIG. 18B is a perspective view of a second alternative configuration of a selector element employing a pair of access lines according to an embodiment of the present disclosure.

FIGS. 18A and 18B illustrate respective planar and non-planar cross bar configurations for a selector element 87 according to alternative embodiments of the present disclosure. In these embodiments, each selector element 87 can be accessed by a pair of access lines. Specifically, each bottom electrode 872 can be a portion of a respective lower access line, and each top electrode 876 can be a portion of a respective upper access line. The lower access lines and the upper access lines can laterally extend along two perpendicular directions (such as the first horizontal direction and the second horizontal direction), and form a rectangular grid with a two-dimensional rectangular array of intersection regions. A memory material layer 874L can be located between the lower access lines and the upper access lines. Each region of the memory material layer 874L located in an overlap region between a pair of a lower access line and an upper access line overlap constitutes a memory element 874. In this embodiment, the memory material layer 874L does not have to be patterned into a pillar, and the electrodes (872, 876) comprise lines rather than portions of a pillar shown in FIGS. 15A and 15B. A dielectric material layer 873 embedding the lower access lines may be employed to provide a planar surface for depositing the memory material layer 874L as a planar material layer as illustrated in FIG. 18A. Alternatively, the memory material layer 874L can be conformally deposited on top surfaces and sidewalls of the lower access lines, and the upper access lines can be formed with topographical features (with height variations) as illustrated in FIG. 18B. The memory material layer 874L can contain any of the materials for providing at least two different resistivity states as discussed above. The lower access lines and the upper access lines can be electrically floating during operation of the two-dimensional array of memory stack structures 55, for example, by turning off transistors configured to drive the lower access lines and the upper access lines.

Figure 19:
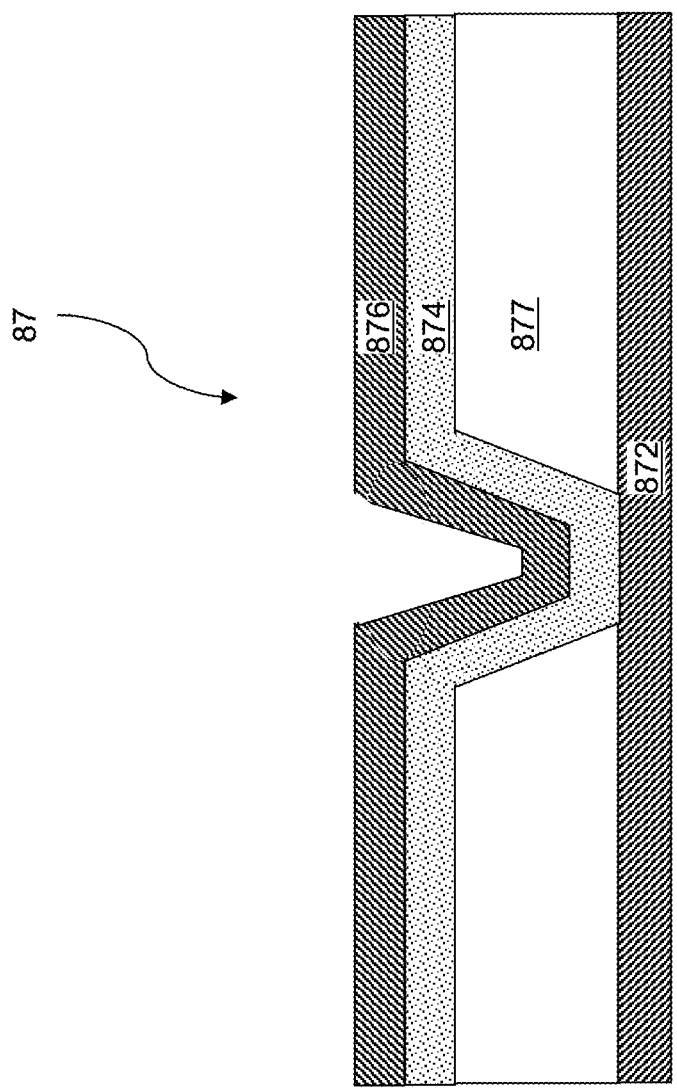
FIG. 19 is a vertical cross-sectional view of a selector element in a via configuration according to an embodiment of the present disclosure.

FIG. 19 illustrates a via configuration for a selector element 87 according to another alternative embodiment. In this case, a selector-level dielectric material layer 877 can be employed, which includes via cavities over each memory stack structure 55. The bottom electrode 872 and the top electrode 876 can be formed as discrete components as illustrated in FIGS. 8A and 8B, or can be formed as portions of lower access lines and/or upper access lines as illustrated in FIGS. 18A and 18B. The contact area between the bottom electrode 872 and the memory element 874 can be limited to the area of the bottom portion of a via cavity through the selector-level dielectric material layer 877.

Figure 20:
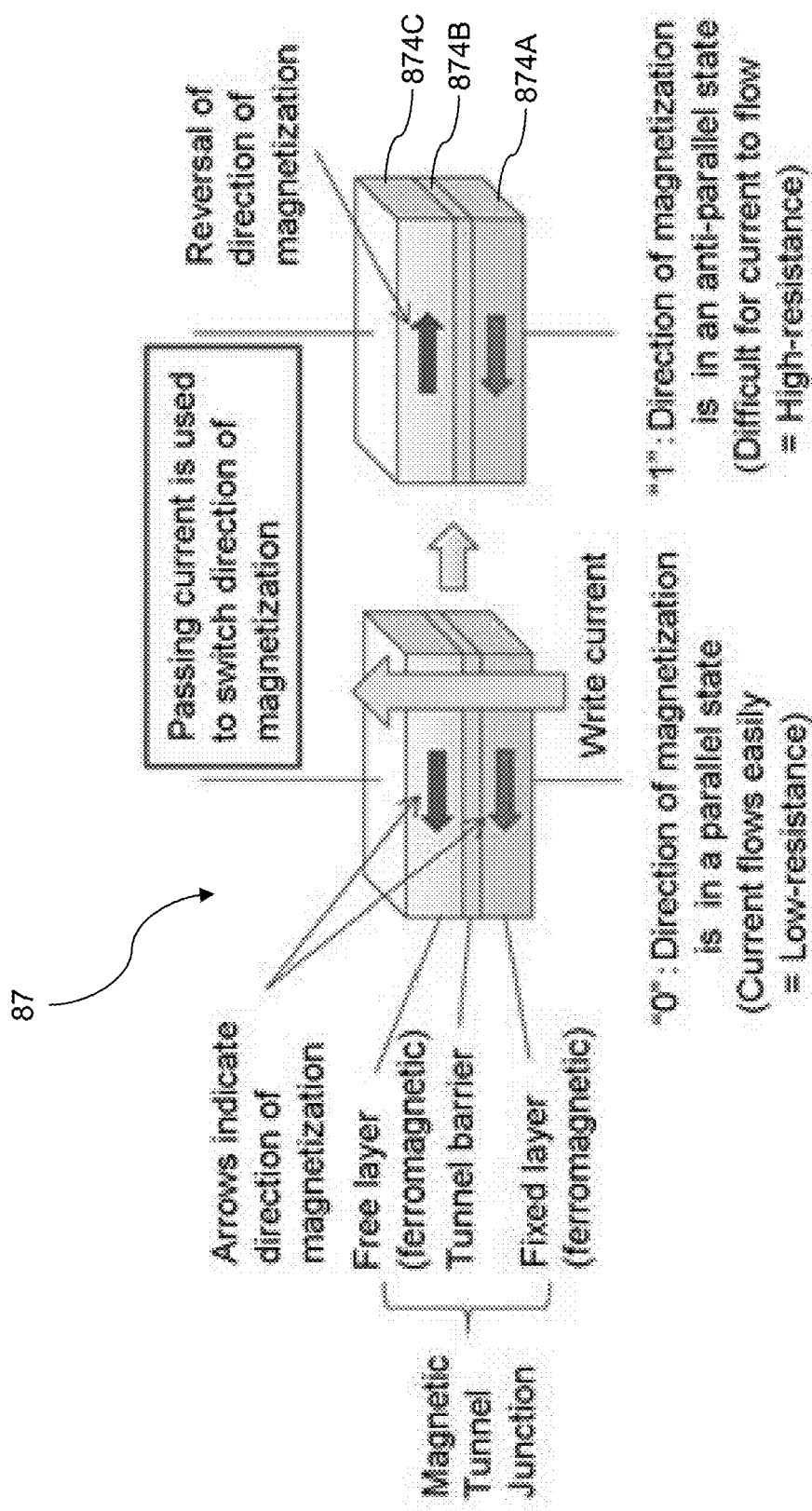
FIG. 20 is a vertical cross-sectional view of a selector element employing a spin-torque-transfer (STT) magnetic memory element according to an embodiment of the present disclosure.

FIG. 20 illustrates a spin-torque-transfer (STT) magnetic memory selector element 87 according to another alternative embodiment. In this case, a memory element 874 comprises a spin-torque-transfer (STT) magnetic memory element containing a magnetic tunnel junction (MTJ) that provides at least two different resistivity states. The resistivity states depend on alignment of a direction of magnetization of a ferromagnetic fixed (i.e., reference) layer 874A (e.g., a CoFeB layer) that is fixed (i.e., pinned) by an antiferromagnetic pinning layer or structure (not shown for clarity), and a direction of magnetization of a ferromagnetic free layer 874C (e.g., another CoFeB layer). The free layer 874C is separated from the fixed layer 874A by a tunneling barrier layer 874B, such as an MgO layer. These layers (874A, 874B, 874C) form the MTJ.

Figures 21A, 21B:
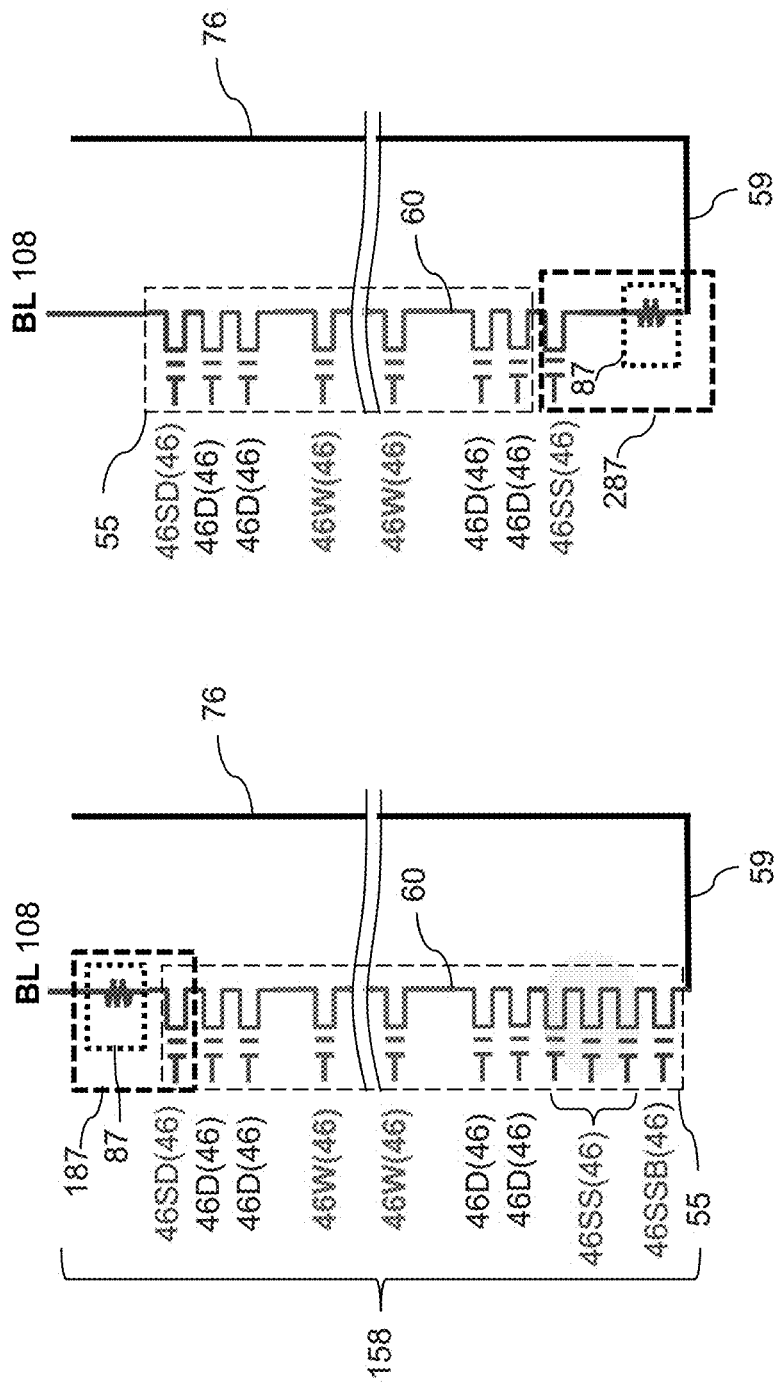
FIG. 21A is a circuit schematic of a first exemplary series connection of a memory stack structure and a selector element according to an embodiment of the present disclosure.
FIG. 21B is a circuit schematic of a second exemplary series connection of a memory stack structure and a selector element according to an embodiment of the present disclosure.

Referring to FIGS. 21A and 21B, circuit diagrams for a series connection of a vertical memory string 158 comprising a selector element 87 and a memory stack structure 55 are illustrated. Generally, a series connection of a selector element 87 and a memory stack structure 55 can be employed to enable selection and inhibition of the memory stack structure 55 in each string 158. The selector element 87 can be a drain side selector element which is part of the drain select device 187 formed over the memory stack structure 55 and underneath a bit line 108 as illustrated in FIG. 21A. Alternatively, the selector element 87 can be a source side selector element which is part of a source select device 287 formed below the memory stack structure 55 (for example, prior to formation of the memory stack structure 55) an between the horizontal semiconductor channel 59 and the memory stack structure 55 as illustrated in FIG. 21B. In one embodiment, the vertical memory string 158 may include both the drain side selector device 187 and the source side selector device 287.

Figure 22:
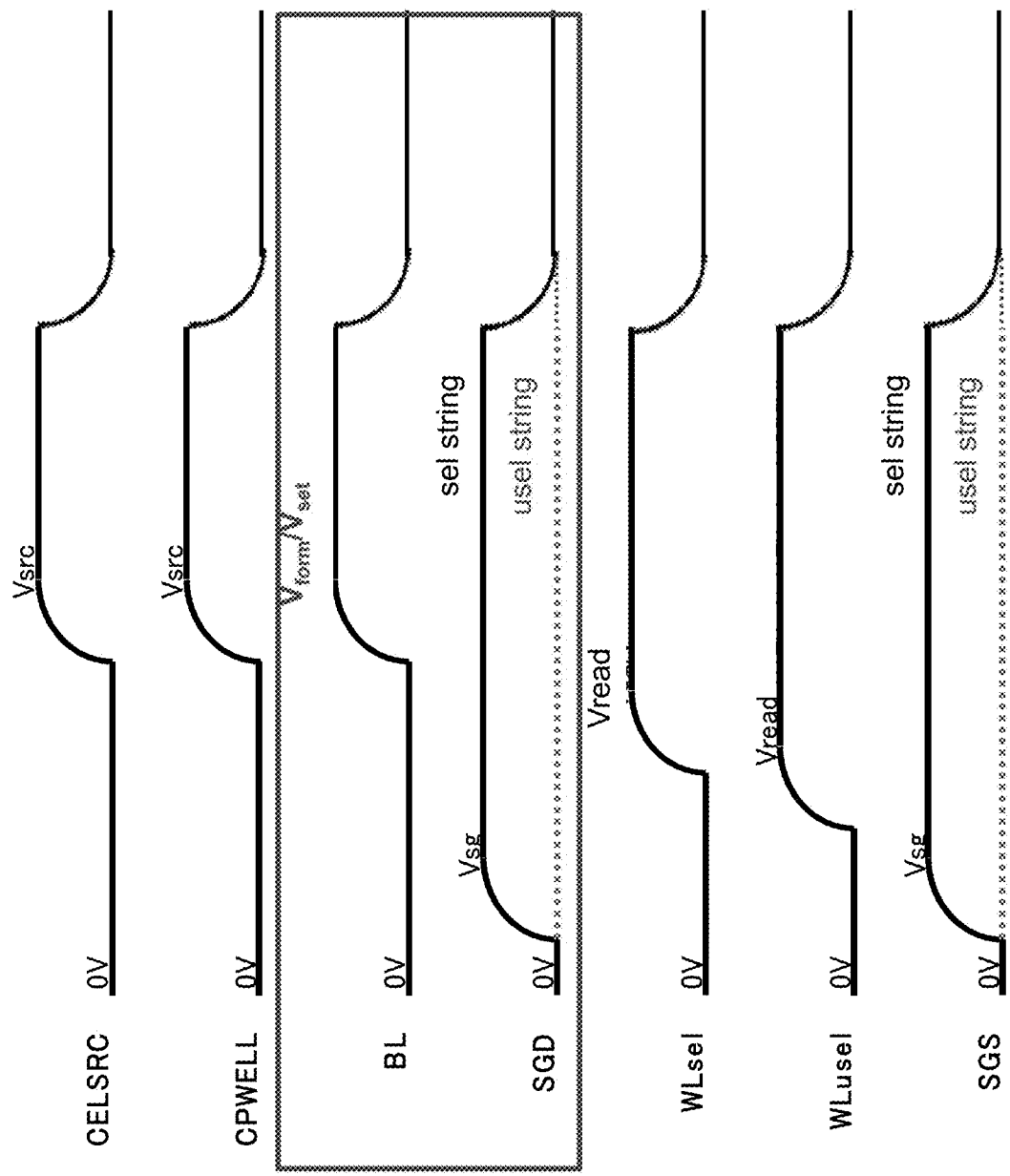
FIG. 22 is a timing diagram for a low-resistivity programming operation for a selector element according to an embodiment of the present disclosure.
Figure 23:
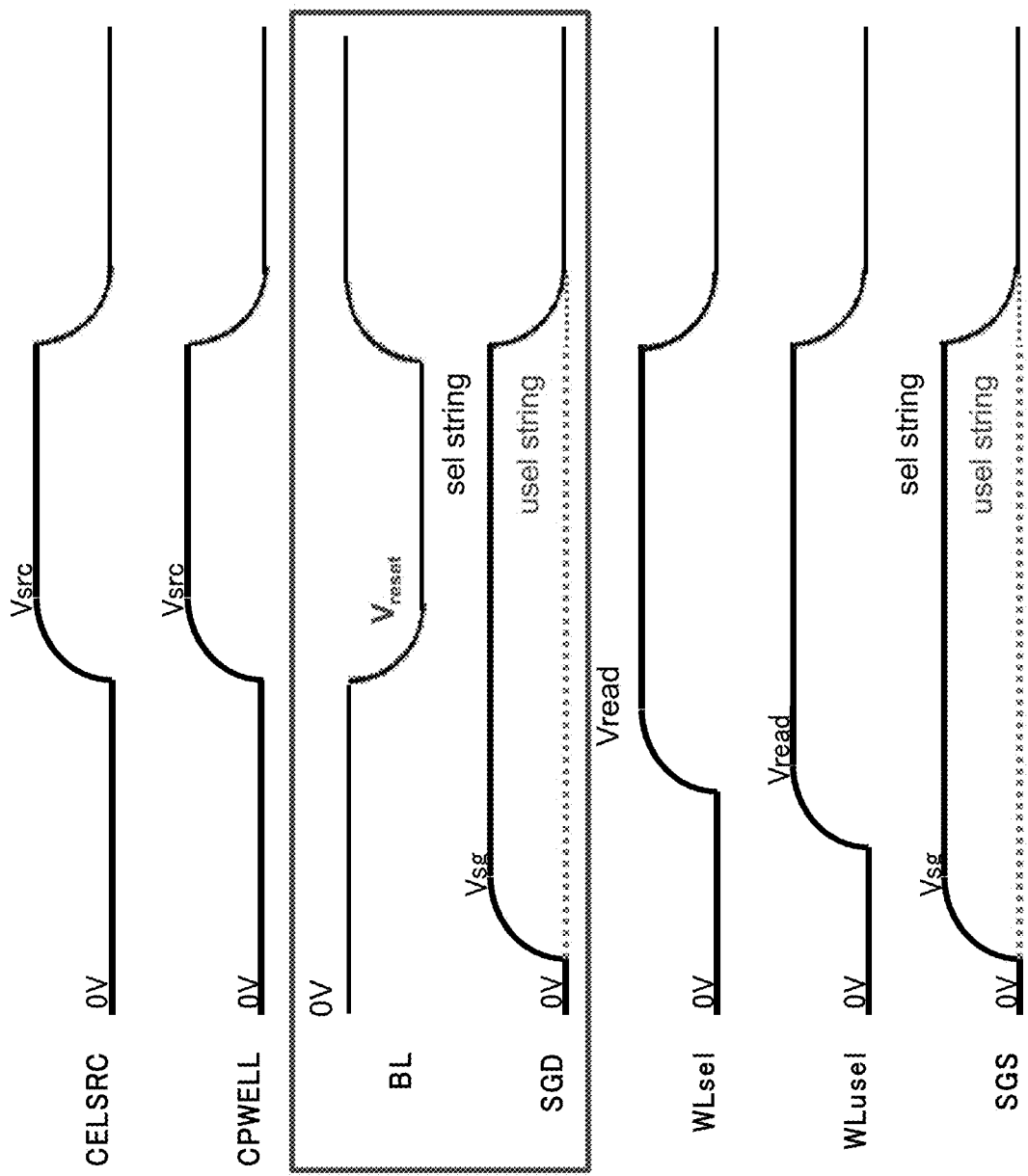
FIG. 23 is a timing diagram for a high-resistivity programming operation for a selector element according to an embodiment of the present disclosure.

FIGS. 22 and 23 illustrate timing diagrams for operating the circuit containing the selector devices 187 described above. The timing and amplitude are schematic and not to scale. FIG. 22 shows the timing diagram for the SET programming operation to set the selector element 87 into a low (i.e., lower) resistivity state. FIG. 23 shows the timing diagram for the RESET programming operation to reset the selector element 87 into a high (i.e., higher) resistivity state. The low resistivity state may be a "set" state for a resistive memory material, a "form" state in which conductive filaments are formed in a filament-forming material, or a crystalline state for a phase change memory material. The high resistivity state may be a "reset" state for a resistive memory material, a "remove" state in which the conductive filaments are removed in a filament-forming dielectric material, or an amorphous state for a phase change memory material.

Specifically, in the SET operation, all electrically conductive layers 46 (e.g., 46W, 46D, 46SD and 46SS/SSB) in the selected memory string 158 are turned on by applying a desired turn on voltage thereto, and a SET voltage is applied to the selector element 87 in the selected memory string 158 to set the selector element 87 into the low resistivity state. In the RESET operation, all electrically conductive layers 46 (e.g., 46W, 46D, 46SD and 46SS/SSB) in the selected memory string 158 are turned on by applying a desired turn on voltage thereto, and a RESET voltage is applied to the selector element 87 in the selected memory string 158 to reset the selector element 87 into the high resistivity state. The set voltage (Vset) may have an opposite polarity and/or a different magnitude compared to the reset voltage (Vreset), depending on the nature of the selector element 87.

The timing diagrams of FIGS. 22 and 23 show a voltage (CEL SRC) to be applied to a source region, such as the source regions 61 (which transitions between 0 V and Vsrc), a voltage (CPWELL) to be applied to a p-type well (e.g., the semiconductor material layer 10) containing the horizontal semiconductor channels 59 (which transitions between 0 V and Vsrc), a voltage (BL) to be allied to bit lines 108 (which can be selected between 0 V, a form voltage or a set voltage Vform/Vset, and a reset voltage Vreset), voltages (SGD) to be applied to drain select electrodes 46SD for a selected string 158 (sel string) and for unselected strings 158 (usel string) (which are selected from 0 V and a select gate turn on voltage Vsg), a voltage (WLsel) to be applied to the selected word line 46W (which is selected between 0 V and a read voltage Vread), a voltage (WLusel) to be applied to the unselected word lines 46W (which is selected between 0 V and a read voltage Vread), and voltages (SGS) to be applied to source-side select electrodes (46SS, 46SSB) for a selected string (sel string) and for unselected strings (usel string) (which are selected from 0 V and the select source turn on voltage Vsg).

Generally, the three-dimensional memory device of the embodiments of the present disclosure can include a plurality of vertical memory strings 158 each containing a series connections of a selector element 87 and a memory stack structure 55. The three-dimensional memory device can be operated by activating a first group of memory strings 158 (which may be located, for example, within the area of a second finger 46F1 of the drain select electrode 46SD in a first memory block 110A in FIG. 17) by setting each selector element 87 within the first group of memory strings 158B to a low (i.e., lower) resistivity state and by deactivating a second group of memory strings 158A, 158C and/or 158D (which may be located, for example, within the area of a first finger 46F0, a third finger 46F2, and/or a fourth finger 46F3 of the drain select electrode 46SD) by setting each selector element 87 within the second group to a high (i.e., higher) resistivity state. An operation selected from programming and/or reading on at least one memory element (which can be located within a respective portion of a charge storage layer 54 that is adjacent to a selected word line 46W) within the first group of memory strings 158B while the second group of memory strings 158A, 158C and/or 158D deactivated.

Figure 24A:
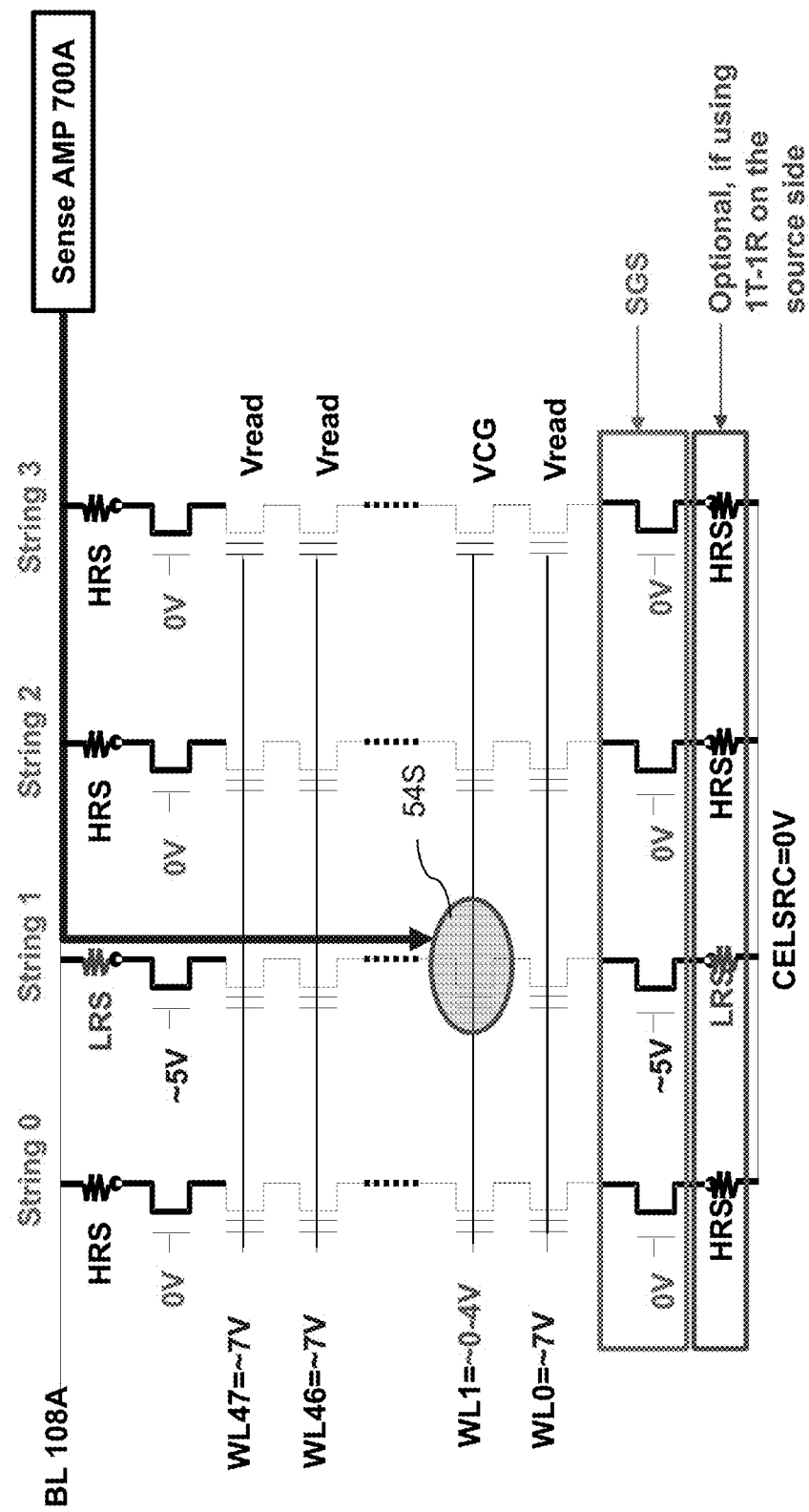
FIG. 24A is a circuit diagram with operational voltage conditions during a read operation according to an embodiment of the present disclosure.

FIG. 24A illustrates a circuit diagram with operational voltage conditions during a read operation of a selected memory cell 54S adjacent to selected word line 46W (labeled WL1 for simplicity in FIG. 24A) in circuit containing the above mentioned four memory strings 158A, 158B, 158C and 158D that are connected to a common bit line BL 108A, and forty eight word lines 46W. The bit line 108A is connected to a sense amplifier 700A during the read operation. The memory strings 158A, 158B, 158C and 158D comprise vertical NAND strings, which are labeled as string 0, string 1, string 2, and string 3, respectively for simplicity in FIG. 24A. String 0 can be located within an area of, and can be activated by, a first finger 46F0. String 1 can be located within an area of, and can be activated by, a second finger 46F1. String 2 can be located within an area of, and can be activated by, a third finger 46F2. String 3 can be located within an area of, and can be activated by, a fourth finger 46F3. Only the selector element 87 connected to the second string (string 1) is at a low resistivity state (LRS), and other selector elements 87 are at a high resistivity state (HRS).

The drain select electrode (i.e., finger 46F1 of electrode 46SD) of the drain select transistor 97 of the second string (string 1) turns on the second string by applying a turn on voltage Vsg, such as a negative voltage, such as −5V or any other suitable voltage, and the drain select electrodes of the drain select transistors 97 of the other strings (i.e., 0, 2 and 3) are set to 0V to turn off the other strings. Likewise, the source select electrode 46SS connected to the second string (string 1) turns on the second string by applying −5V (or any suitable voltage), and the source-select electrodes connected to other strings are set to 0V to turn off the other strings.

A configuration including forty eight word lines (from WL0 to WL47) is illustrated. The selected word line in this case is the second word line (WL1). Suitable voltages are applied to each of the word lines to select the second word line (WL1) and to unselect all other word lines. Optionally, a two terminal selector element 87 may be provided on the source side instead of, or in addition to, the selector element 87 on the drain side for each NAND string. A read operation can be performed on the selected memory element 54S, i.e., the memory element located in the second NAND string 158B and adjacent to the second word line (WL1).

Figure 24B:
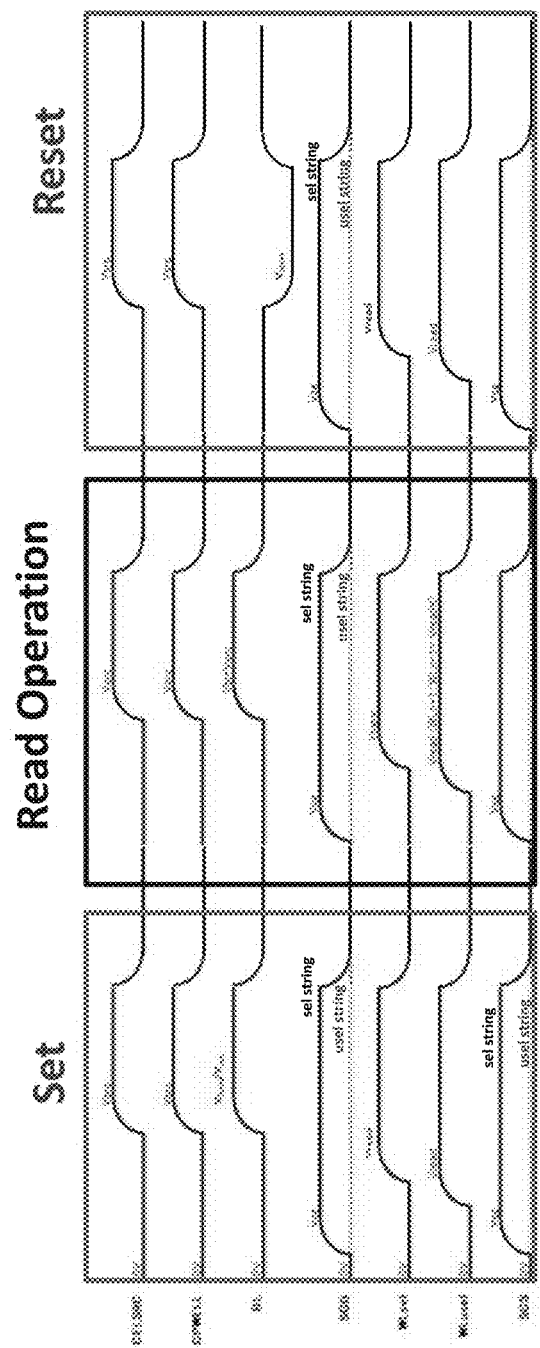
FIG. 24B is a timing diagram for the read operation of the circuit shown in FIG. 24A.

FIG. 24B illustrates a timing diagram for the read operation of the circuit illustrated in FIG. 24A. As shown in FIG. 24B, the selector element 87 in the selected memory string 158B (i.e., string 1) is set into the low resistivity state prior to the read operation, using the timing diagram shown in FIG. 22. The read operation is then performed, as described with respect to FIG. 24A above. The selector element 87 in the selected memory string 158B (i.e., string 1) is then reset into the high resistivity state after the read operation, using the timing diagram shown in FIG. 23.

Figure 25A:
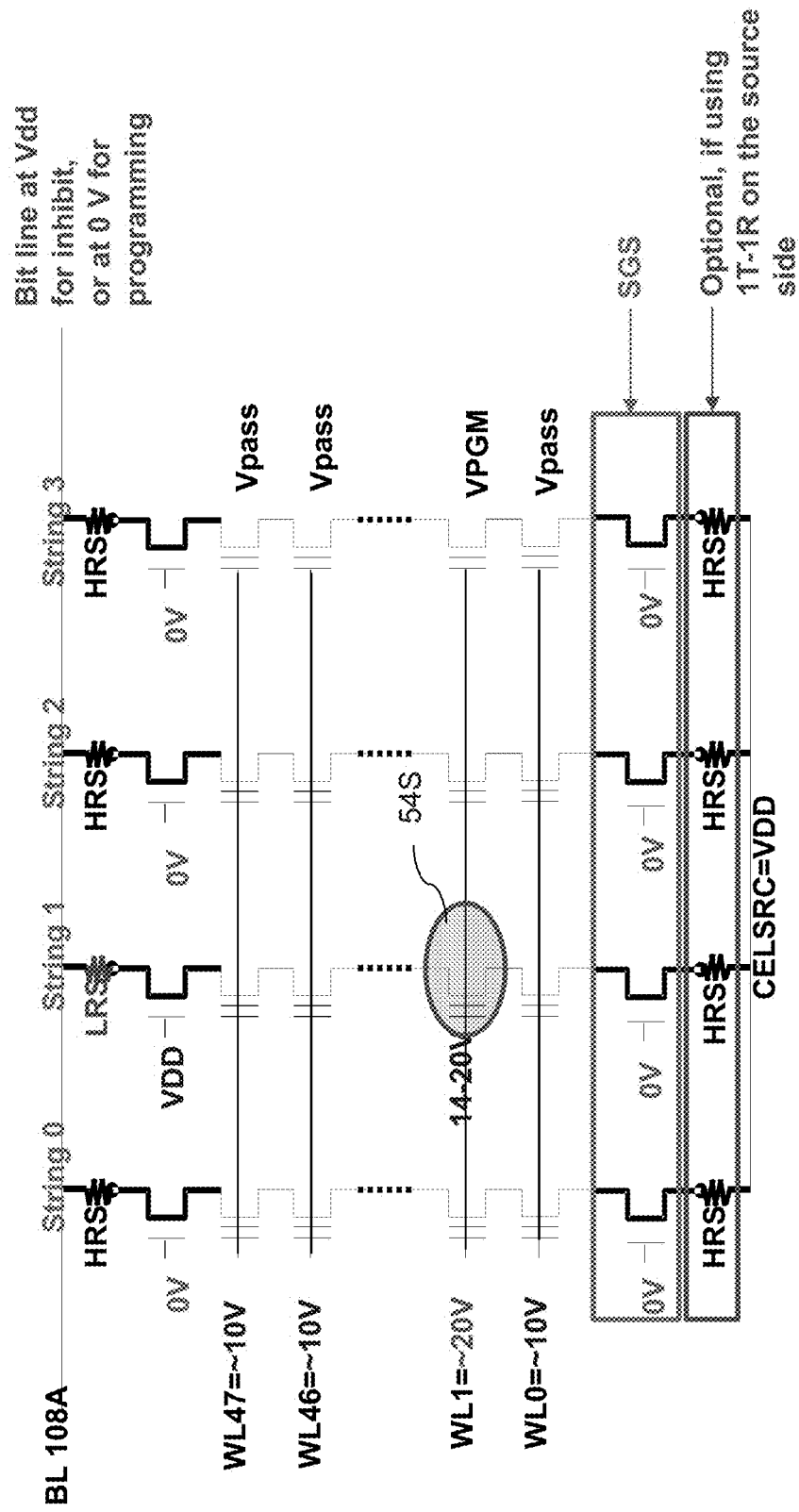
FIG. 25A is a circuit diagram with operational voltage conditions during a programming operation according to an embodiment of the present disclosure.

Referring to FIG. 25A, a circuit diagram is illustrated during a programming operation of the selected memory cell 54S shown in FIG. 24A. In this case, only the selector element 87 located on the drain side of the selected NAND string is set into the low resistivity state. Suitable voltages can be applied to various nodes of the three-dimensional memory device to program the selected memory cell.

Figure 25B:
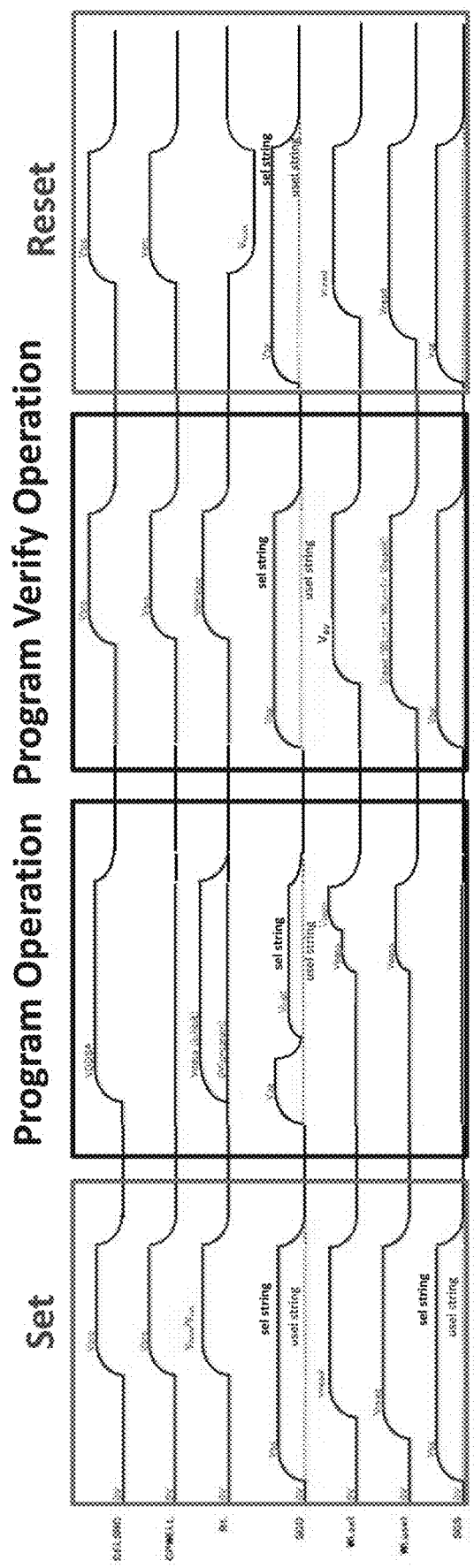
FIG. 25B is a timing diagram for the programming operation of the circuit shown in FIG. 25A.

FIG. 25B illustrates a timing diagram for the programming operation of the circuit illustrated in FIG. 25A. As shown in FIG. 25B, the selector element 87 in the selected memory string 158B (i.e., string 1) is set into the low resistivity state prior to the programming operation, using the timing diagram shown in FIG. 22. The program and program verify operations are then performed, as described with respect to FIG. 25A above. The selector element 87 in the selected memory string 158B (i.e., string 1) is then reset into the high resistivity state after the program and verify operations, using the timing diagram shown in FIG. 23.

Figure 26A:
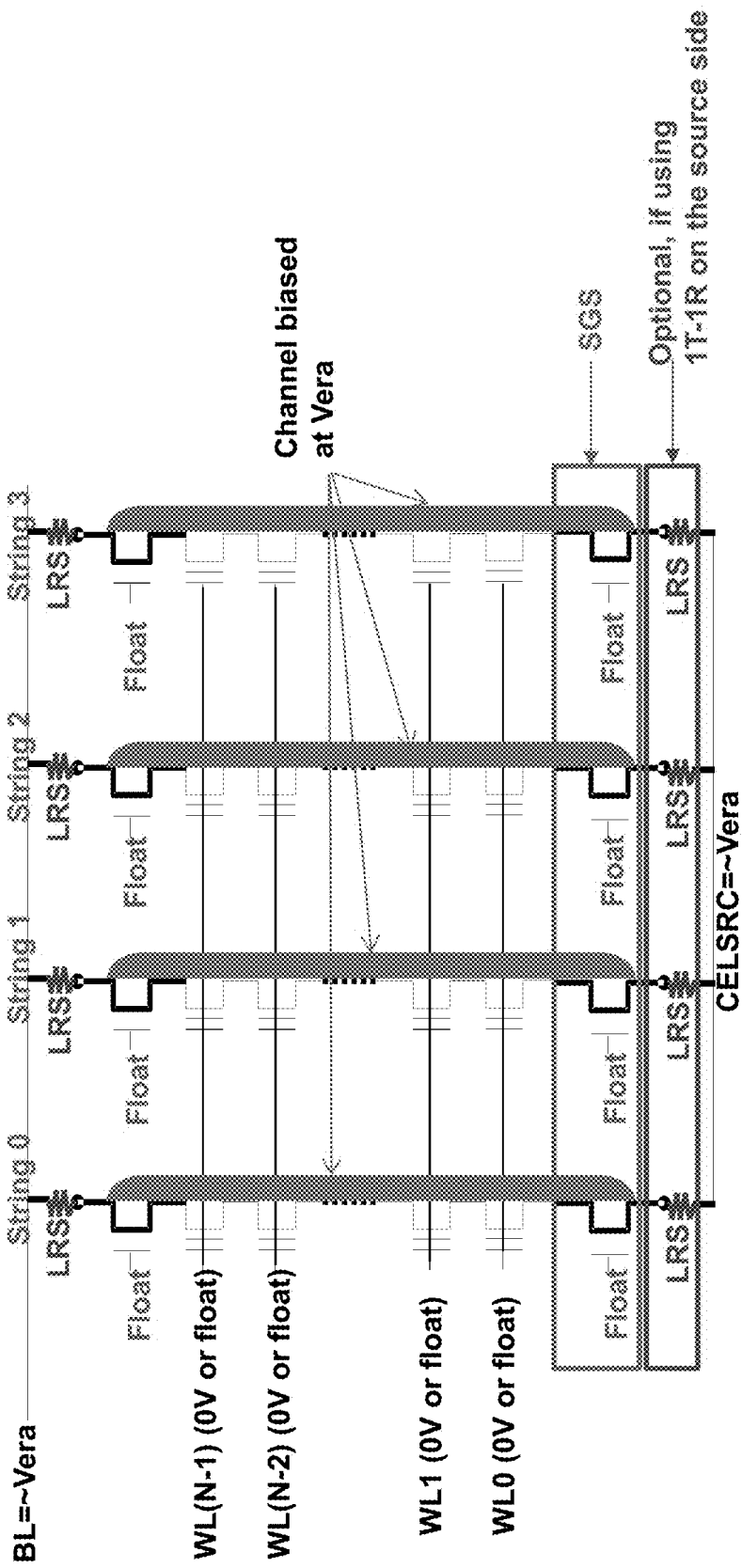
FIG. 26A is a circuit diagram with operational voltage conditions during an erase operation according to an embodiment of the present disclosure.

Referring to FIG. 26A, a circuit diagram is illustrated during an erase operation of the circuit shown in FIG. 24A. All vertical semiconductor channels 60 can be biased at an erase voltage Vera after setting into the low resistivity state all of the selector elements 87.

Figure 26B:
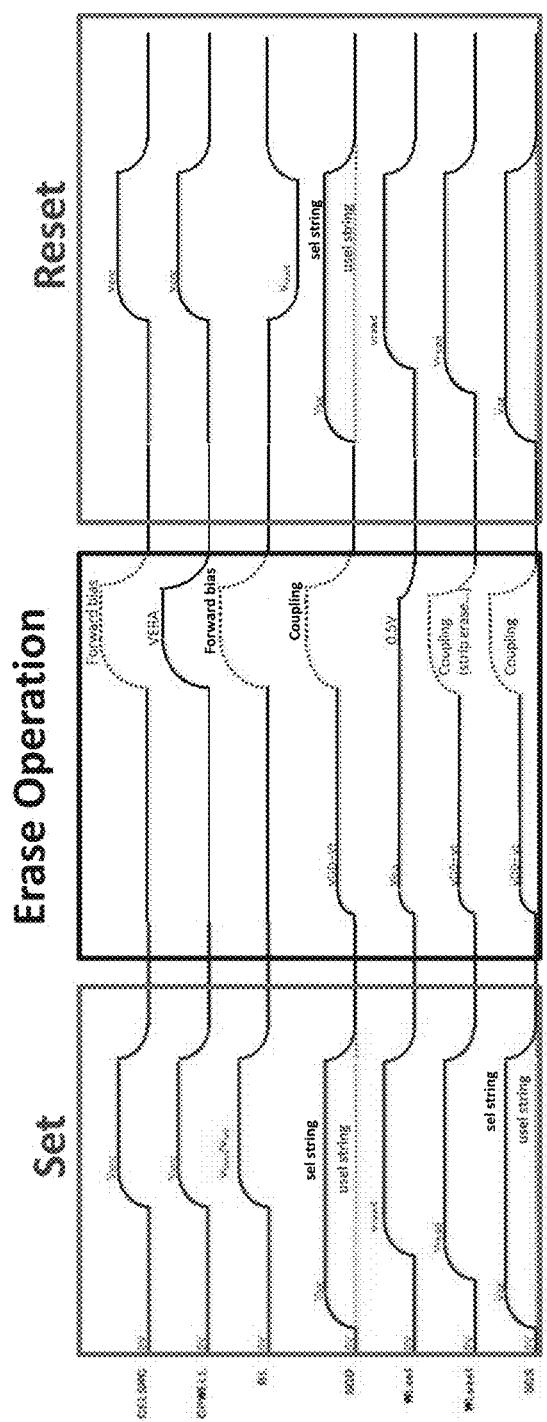
FIG. 26B is a timing diagram for the erase operation of the circuit shown in FIG. 26A.

FIG. 26B illustrates a timing diagram for the erase operation of the circuit illustrated in FIG. 26A. As shown in FIG. 26B, the selector elements 87 of all memory strings 158A-158D (i.e., strings 0-3) are set into the low resistivity state prior to the erase operation, using the timing diagram shown in FIG. 22. The erase operation is then performed, as described with respect to FIG. 26A above. The selector elements 87 of all memory strings are then reset into the high resistivity state after the erase read operation, using the timing diagram shown in FIG. 23.

Referring to all drawings and according to various embodiments of the present disclosure, a three-dimensional memory device is provided, which comprises: an alternating stack of insulating layers 32 and electrically conductive word line layers 46W located over a substrate (9, 10); and a plurality of vertical memory strings 158, wherein each vertical memory string 158 comprises a series connection of a memory stack structure 55 and a selector element 87. Each of the memory stack structures 55 extends through the alternating stack (32, 46W) and includes a respective memory film 50 and a respective vertical semiconductor channel 60. Each of the selector elements 87 comprises a two terminal device that is configured to provide at least two different resistivity states (e.g., high and low resistivity states). The ratio of the resistivity of the high resistivity state to the resistivity of the low resistivity state may be in a range from 30 to $1.0 \times 10^{18}$, such as from $1.0 \times 10^4$ to $1.0 \times 10^{12}$, although lesser and greater ratios can also be employed.

In one embodiment, the three-dimensional memory device comprises bit lines 108 that are laterally spaced apart along a first horizontal direction hd1, laterally extend along a second horizontal direction hd2, and are electrically connected to top ends of the vertical memory strings 158 In one embodiment, each of the selector elements 87 is located between the alternating stack (32, 46W) and the bit lines 108, while dummy word lines 46D are located between the selector elements 86 and the electrically conductive word line layers 46W.

In one embodiment, each of the selector elements 87 comprises a vertical stack of a bottom electrode 872, a memory element 874, and a top electrode 876, the top electrode 876 is electrically connected to one of the bit lines 108, and the bottom electrode 872 is electrically connected to a respective one of the vertical semiconductor channels 60 through a respective drain region 63. In one embodiment, the respective drain region 63 contacts the bottom electrode 872 and the respective one of the vertical semiconductor channels 60.

In one embodiment, the memory element 874 comprises a vacancy-modulated memory element that provides a variable density of oxygen vacancies within a dielectric metal oxide material depending on a direction and a magnitude of an applied electrical field thereacross.

In one embodiment, the memory element 874 comprises a conductive bridge memory element that provides a variable density of conductive filaments within a dielectric film depending on a direction and magnitude of an applied electrical field thereacross.

In one embodiment, the memory element 874 comprises a phase change memory element that provides at least two different resistivity states depending on crystallinity of a phase change material contained therein.

In one embodiment, the memory element 874 comprises a spin-torque-transfer (STT) magnetic memory element containing the MTJ that provides at least two different resistivity states depending on alignment of a direction of magnetization of a reference layer therein and a direction of magnetization of a free layer therein.

In one embodiment, the selector element 87 has a pillar structure with a uniform horizontal cross-sectional shape that is invariant with translation of a horizontal cross-sectional plane along a vertical direction.

In one embodiment, the top electrode 876 of the selector element 87 and the bottom electrode 872 of the selector element laterally extend along different horizontal directions, and the memory element 874 is located within an overlap area between the top electrode 876 and the bottom electrode 872.

In one embodiment, each of the memory stack structures 55 is located within a respective memory opening 49 that vertically extends through the alternating stack (32, 46), each bottom end of the vertical semiconductor channels 60 is electrically connected to a semiconductor material layer 10 within the substrate (9, 10), and each memory film 50 comprises a stack including a respective blocking dielectric 52, a respective set of charge storage elements (which may be embodied, for example, as portions of a charge storage layer 54), and a respective tunneling dielectric 56. In one embodiment, each vertical memory string 158 comprises a series connection of a memory stack structure 55 and a selector device (187, 287). The selector device (187, 287) comprises a series connection of a select transistor 97 and the selector element 87.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). Support pillar structures 20 can extend through the stepped surfaces and through a retro-stepped dielectric material portion 65 that overlies the stepped surfaces.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The selector elements 87 can be programmed to activate and deactivate selected vertical NAND strings 158, thereby reducing the leakage current and boosting loss in the three-dimensional memory device. Thus, activation of selected vertical NAND strings 158B can become more selective with more effective suppression of leakage current through unselected vertical NAND strings 158A, 158C and 158D. The selector elements 87 may provide Ohmic or near Ohmic conduction in the low resistivity state. Furthermore, the selector devices 187 may include only one select transistor 97 with one select electrode (e.g., drain select electrode 46SD). This provides more space for word lines 46W by omitting additional select transistors and select electrodes on the same side (e.g., drain side) of the device. The two terminal selector elements 87 have a relatively simple structure compared to the select transistors may be formed by a relatively simple process.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive word line layers located over a substrate; and
   a plurality of vertical memory strings, wherein each vertical memory string comprises a series connection of a memory stack structure and a selector element;
   wherein:
   each of the memory stack structures extends through the alternating stack and includes a respective memory film and a respective vertical semiconductor channel; and
   each of the selector elements comprises a two terminal device that is configured to provide at least two different resistivity states and has a bottom surface that overlies a topmost layer of the alternating stack and overlies a horizontal plane including topmost surfaces of the vertical semiconductor channels.

2. The three-dimensional memory device of claim 1, wherein:
   each of the selector elements comprises a vertical stack of a bottom electrode, a memory element, and a top electrode;
   the top electrode is electrically connected to one of the bit lines; and
   the bottom electrode is electrically connected to a respective one of the vertical semiconductor channels through a respective drain region.

3. The three-dimensional memory device of claim 2, wherein the respective drain region contacts the bottom electrode and the respective one of the vertical semiconductor channels.

4. The three-dimensional memory device of claim 2, wherein the memory element comprises a vacancy-modulated memory element.

5. The three-dimensional memory device of claim 2, wherein the memory element comprises a conductive-bridge memory element.

6. The three-dimensional memory device of claim 2, wherein the memory element comprises a phase change memory element.

7. The three-dimensional memory device of claim 2, wherein the memory element comprises a spin-torque-transfer (STT) magnetic memory element containing a magnetic tunneling junction.

8. The three-dimensional memory device of claim 2, wherein the selector element has a pillar structure.

9. The three-dimensional memory device of claim 2, wherein:
the top electrode of the selector element and the bottom electrode of the selector element laterally extend along different horizontal directions; and
the memory element is located within an overlap area between the top electrode and the bottom electrode.

10. The three-dimensional memory device of claim 1, wherein:
each of the memory stack structures is located within a respective memory opening that vertically extends through the alternating stack; and
each memory film comprises a stack including a respective blocking dielectric, a respective set of charge storage elements, and a respective tunneling dielectric.

11. The three-dimensional memory device of claim 1, wherein:
each vertical memory string comprises a series connection of a memory stack structure and a selector device; and
the selector device comprises a series connection of a select transistor and the selector element.

12. A method of operating the three-dimensional memory device of claim 1, comprising:
activating a first group of vertical memory strings by setting each selector element within the first group to a low resistivity state and deactivating a second group of vertical memory strings by setting each selector element within the second group to a high resistivity state; and
performing an operation selected from programming or reading least one memory element within the first group of vertical memory strings while the second group of vertical memory strings remains deactivated.

13. The method of claim 12, further comprising deactivating the first group of vertical memory strings by setting each selector element within the first group of vertical memory strings to the high resistivity state after the programming or reading operation.

14. The method of claim 13, further comprising:
activating the first and the second groups of vertical memory strings by setting each selector element within the first and second groups of vertical memory strings to the low resistivity state;
performing an erase operation on the first and second groups of vertical memory strings; and
deactivating the first and second groups of vertical memory strings by setting each selector element within the first and second groups of vertical memory strings to the high resistivity state after the erase operation.

15. The three-dimensional memory device of claim 1, wherein:
the vertical semiconductor channels have a doping of a first conductivity type;
a top end of each of the vertical semiconductor channels in contact with a respective drain region having a doping of a second conductivity type that is an opposite of the first conductivity type; and
each of the drain regions is in contact with a bottom surface of a respective one of the selector elements.

16. A method of forming a three-dimensional memory device, comprising:
forming an alternating stack of insulating layers and electrically conductive layers and a two-dimensional array of memory stack structures vertically extending therethrough over a substrate, wherein each of the memory stack structures includes a respective memory film and a respective vertical semiconductor channel; and
forming a two-dimensional array of two terminal selector elements over the two-dimensional array of memory stack structures, wherein a two-dimensional array of series connections of a memory stack structure and a selector element is formed, wherein each of the selector elements is configured to provide at least two different resistivity states, and wherein each of the selector elements has a bottom surface that overlies a topmost layer of the alternating stack and overlies a horizontal plane including topmost surfaces of the vertical semiconductor channels.

17. The method of claim 16, further comprising forming bit lines on the two-dimensional array of selector elements, wherein the plurality of bit lines are laterally spaced apart along a first horizontal direction, laterally extend along a second horizontal direction, and are electrically connected to top ends of the selector elements.

18. The method of claim 16, wherein:
each of the selector elements comprises a vertical stack of a bottom electrode, a memory element, and a top electrode; and
the bottom electrode is electrically connected to a respective one of the vertical semiconductor channels through a respective drain region.

19. The method of claim 16, further comprising forming access lines over the alternating stack, wherein each of the access lines comprises bottom electrodes or top electrodes of a respective subset of the selector elements.

20. The method of claim 16, wherein:
the vertical semiconductor channels have a doping of a first conductivity type;
the method comprises forming drain regions comprising a doped semiconductor material having a doping of a second conductivity type that is an opposite of the first conductivity type on top ends of the vertical semiconductor channels; and
the selector elements are formed on top surfaces of the drain regions.

* * * * *